(12) United States Patent
Maeyama et al.

(10) Patent No.: US 10,115,346 B2
(45) Date of Patent: Oct. 30, 2018

(54) DISPLAY DEVICE, DRIVING METHOD, AND ELECTRONIC APPARATUS

(71) Applicant: JOLED INC., Tokyo (JP)

(72) Inventors: Koichi Maeyama, Tokyo (JP); Teppei Isobe, Tokyo (JP)

(73) Assignee: JOLED INC., Tokyo (JP)

( * ) Notice: Subject to any disclaimer, the term of this patent is extended or adjusted under 35 U.S.C. 154(b) by 63 days.

(21) Appl. No.: 15/306,658

(22) PCT Filed: Feb. 10, 2015

(86) PCT No.: PCT/JP2015/053586
§ 371 (c)(1),
(2) Date: Oct. 25, 2016

(87) PCT Pub. No.: WO2015/166681
PCT Pub. Date: Nov. 5, 2015

(65) Prior Publication Data
US 2017/0047012 A1 Feb. 16, 2017

(30) Foreign Application Priority Data

Apr. 28, 2014 (JP) .................. 2014-092770

(51) Int. Cl.
*G09G 3/3291* (2016.01)
*G09G 3/3258* (2016.01)
(Continued)

(52) U.S. Cl.
CPC ............. *G09G 3/3258* (2013.01); *G09G 3/20* (2013.01); *G09G 3/30* (2013.01); *G09G 3/3291* (2013.01);
(Continued)

(58) Field of Classification Search
CPC .............. G09G 3/3258; G09G 3/3291; G09G 2310/08; G09G 2300/0828; G09G 2300/0452
See application file for complete search history.

(56) References Cited

U.S. PATENT DOCUMENTS

2002/0036625 A1 3/2002 Nakamura
2002/0075211 A1 6/2002 Nakamura
(Continued)

FOREIGN PATENT DOCUMENTS

JP 2002156954 A 5/2002
JP 2003288055 A 10/2003
(Continued)

OTHER PUBLICATIONS

International Search Report and Written Opinion issued in International Patent Application No. PCT/JP2015/053586, dated May 19, 2015; with English translation.

*Primary Examiner* — Shaheda Abdin
(74) *Attorney, Agent, or Firm* — McDermott Will & Emery LLP

(57) ABSTRACT

A display device according to the disclosure includes: a display section having a plurality of unit pixels; and a driving section that, in a first drive mode, performs write driving and thereafter performs light emission driving in a plurality of light-emitting periods on each of the unit pixels. One of predetermined number of light-emitting periods out of the plurality of light-emitting periods other than a first light-emitting period is longer than the first light-emitting period, and another one of the predetermined number of light-emitting periods is shorter than the first light-emitting period.

19 Claims, 19 Drawing Sheets

(51) Int. Cl.
 G09G 3/20 (2006.01)
 G09G 3/30 (2006.01)
 H01L 51/50 (2006.01)
(52) U.S. Cl.
 CPC ..... *H01L 51/50* (2013.01); *G09G 2300/0452* (2013.01); *G09G 2300/0828* (2013.01); *G09G 2310/08* (2013.01)

(56) References Cited

U.S. PATENT DOCUMENTS

| 2002/0135312 A1* | 9/2002 | Koyama | G09G 3/3225 |
| | | | 315/169.3 |
| 2003/0214493 A1 | 11/2003 | Akimoto et al. | |
| 2009/0122207 A1 | 5/2009 | Inoue et al. | |
| 2009/0167649 A1* | 7/2009 | Ishizuka | G09G 3/3258 |
| | | | 345/80 |

FOREIGN PATENT DOCUMENTS

| JP | 2003330422 A | 11/2003 |
| JP | 2004325749 A | 11/2004 |
| JP | 2006-018312 A | 1/2006 |
| JP | 2007333768 A | 12/2007 |
| JP | 2008033066 A | 2/2008 |
| WO | 2006/100988 A1 | 9/2006 |

* cited by examiner

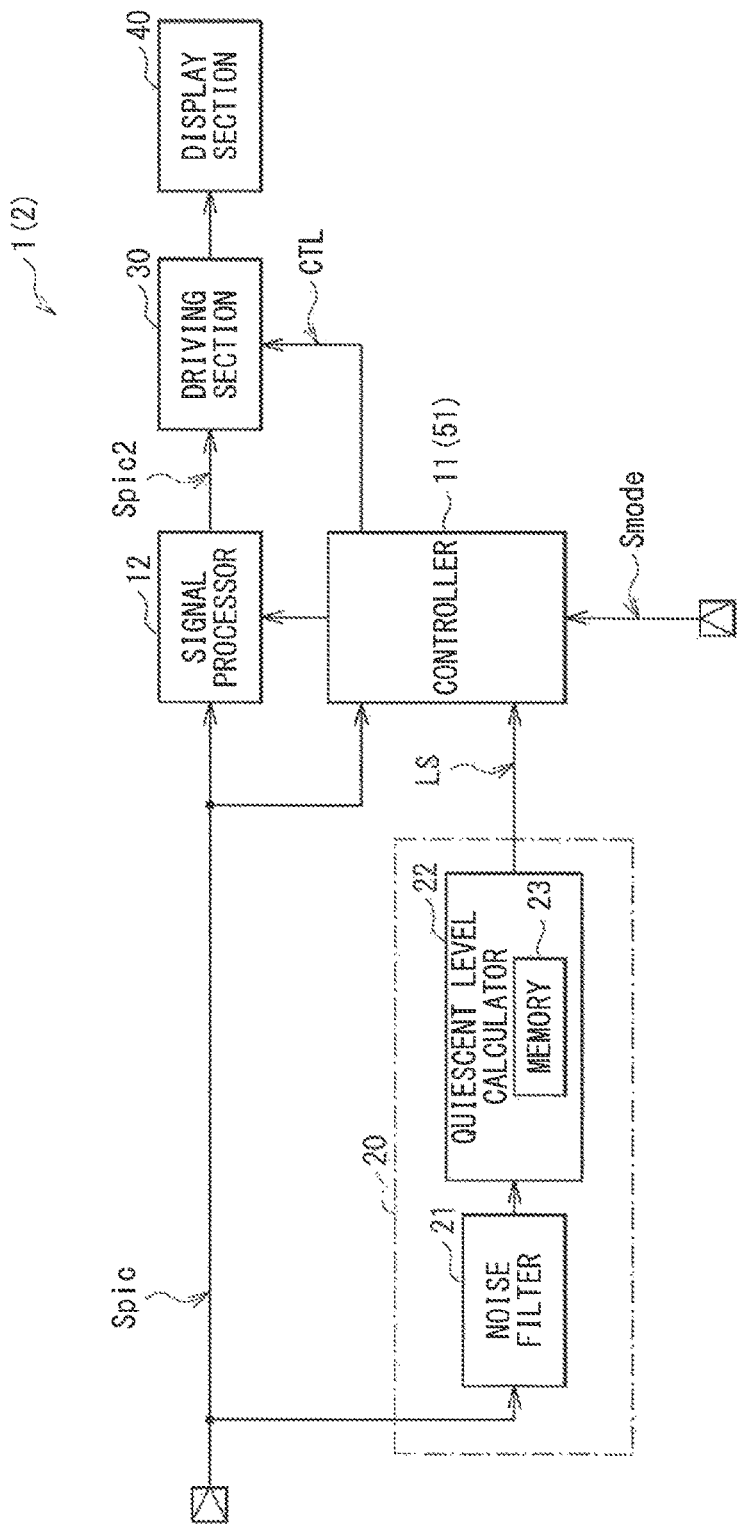
[FIG. 1]

[FIG. 2]
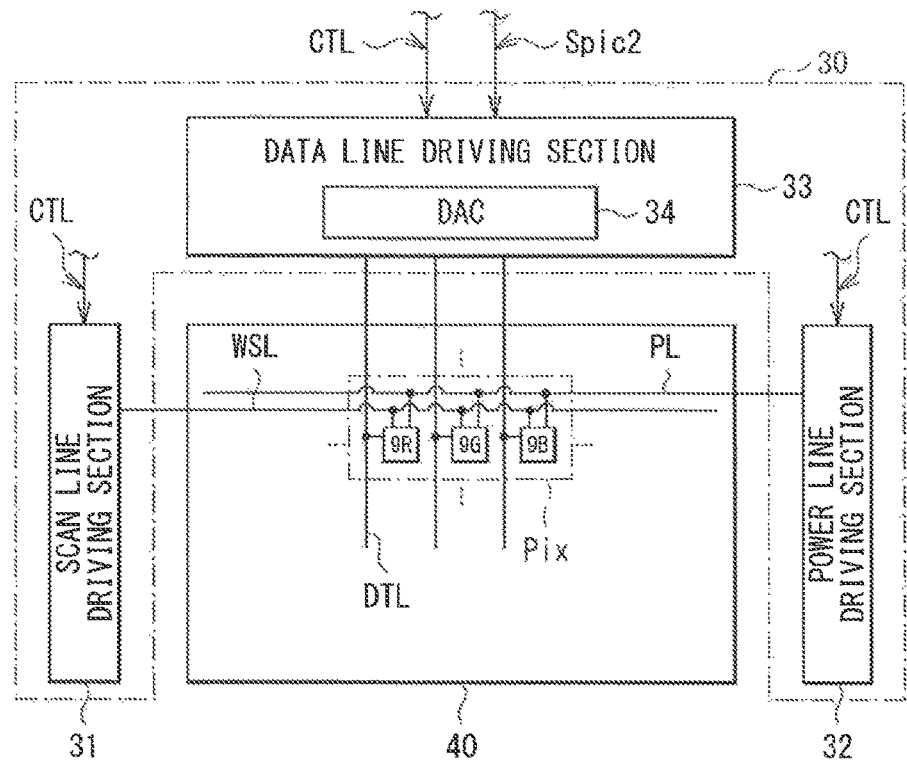
[FIG. 3]
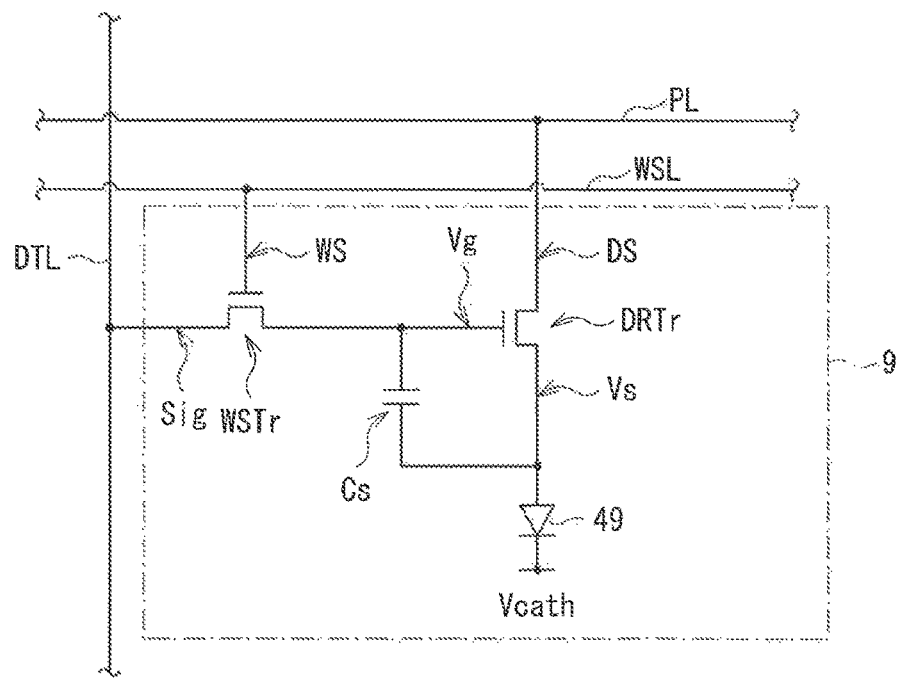

[ FIG. 4 ]
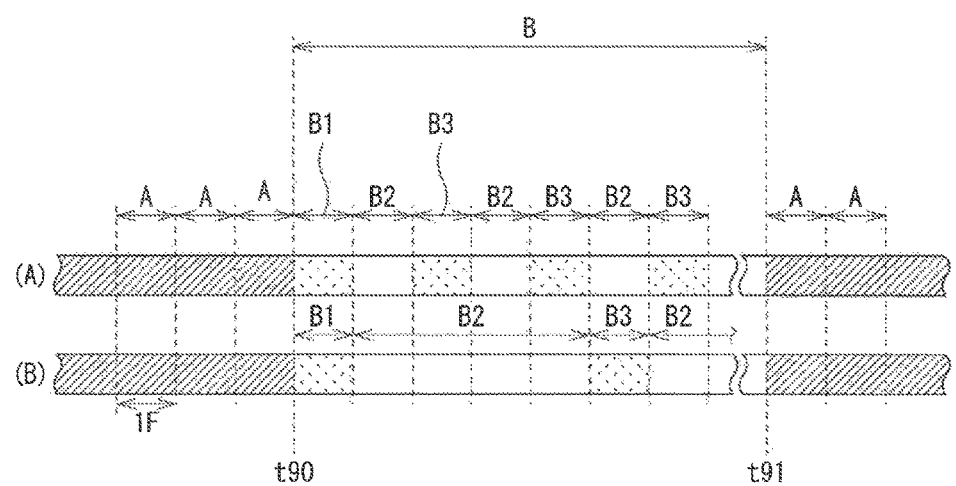
[ FIG. 5 ]
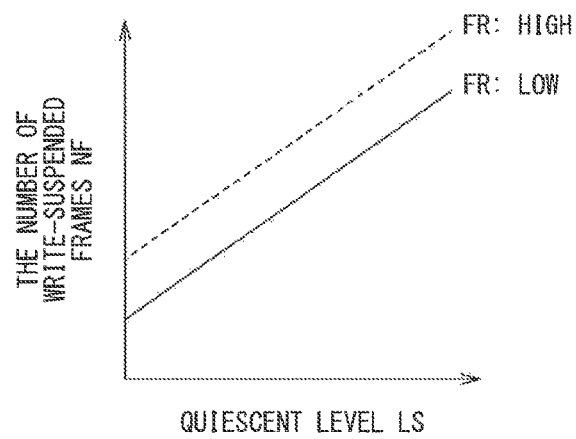

[FIG. 6]
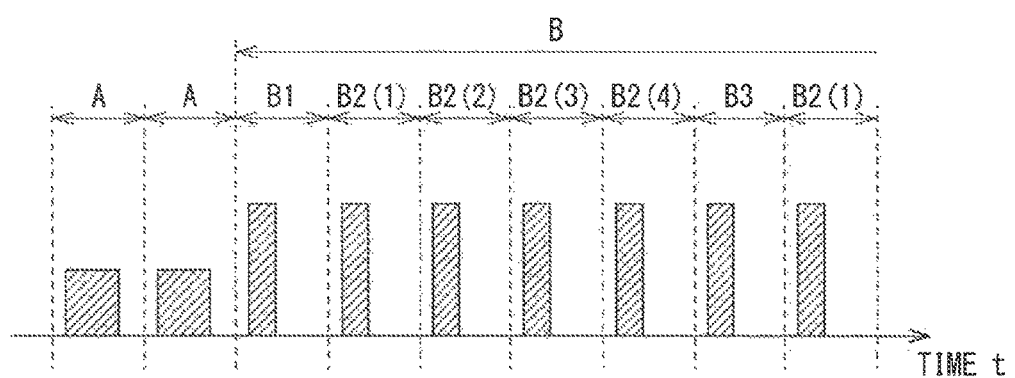

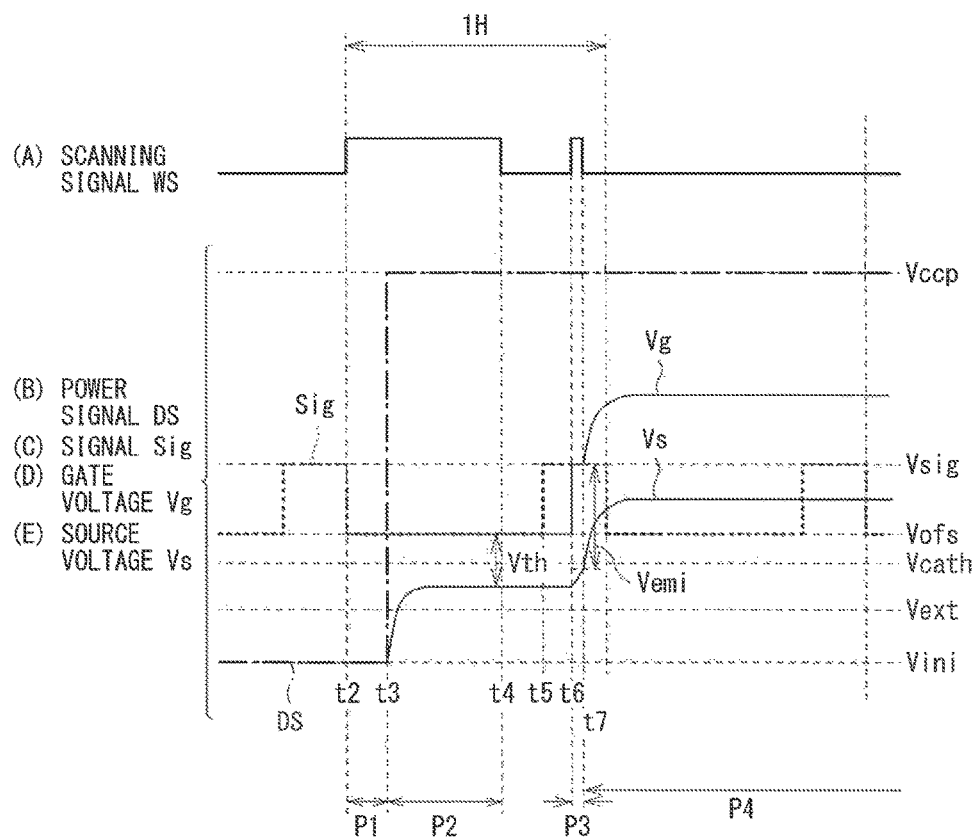

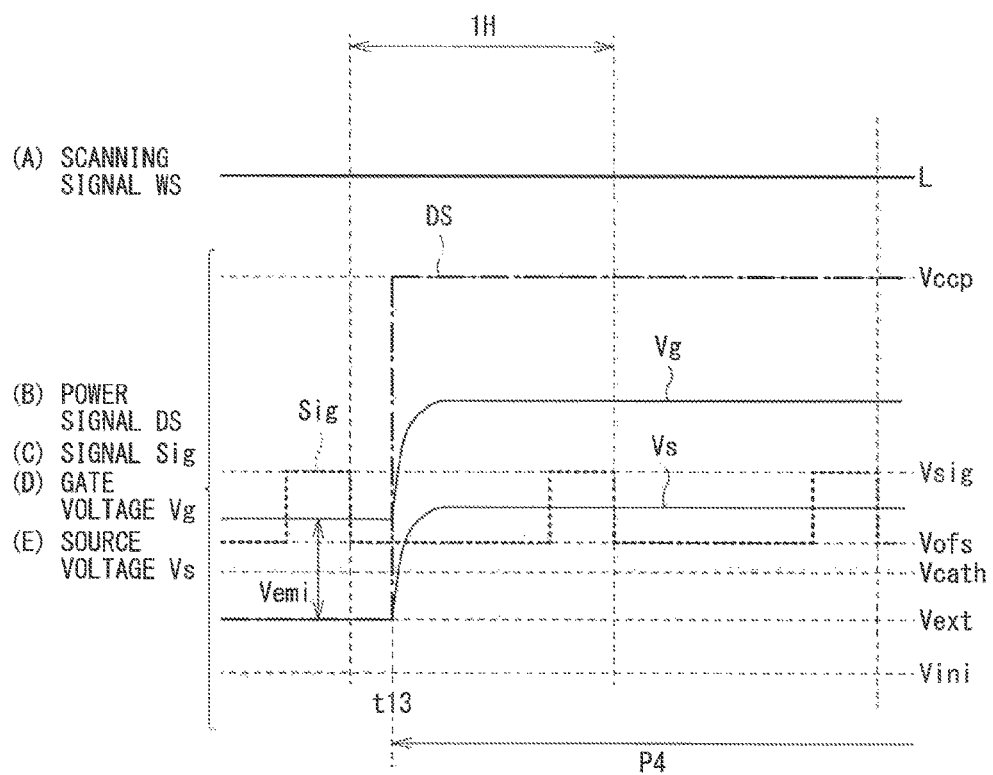

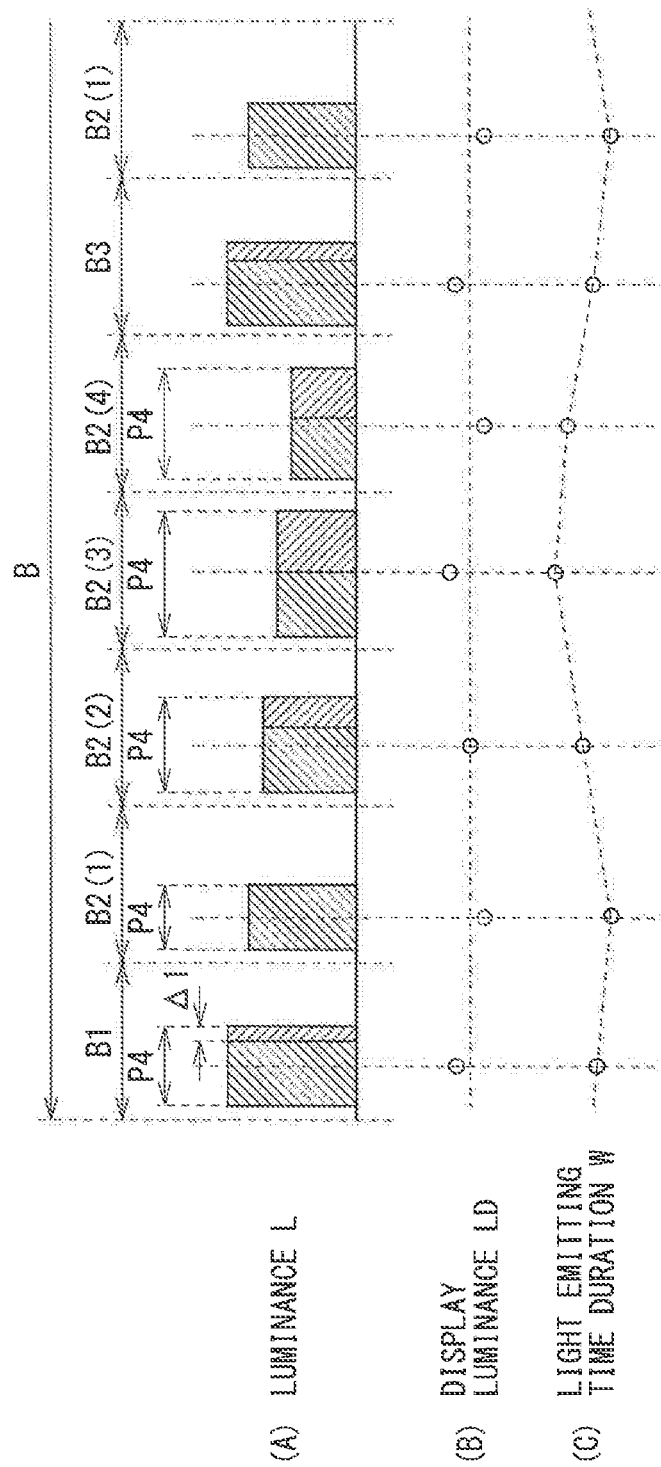
[FIG. 9]

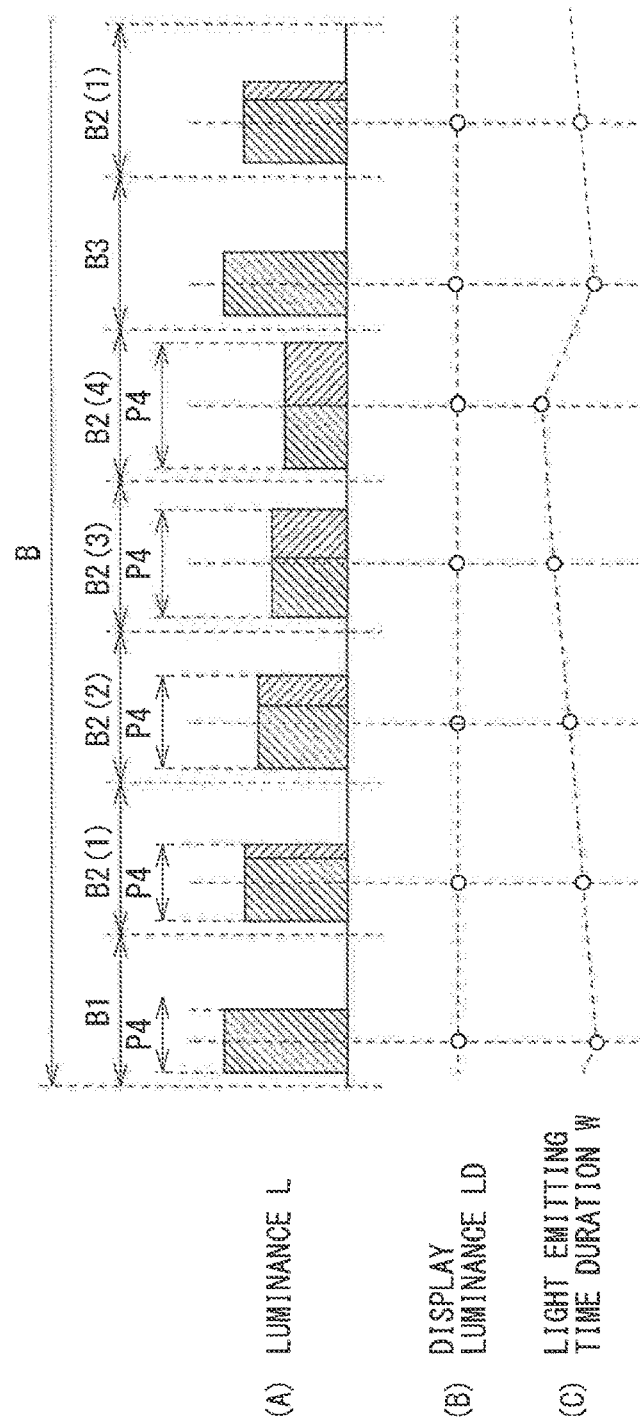

[ FIG. 11 ]
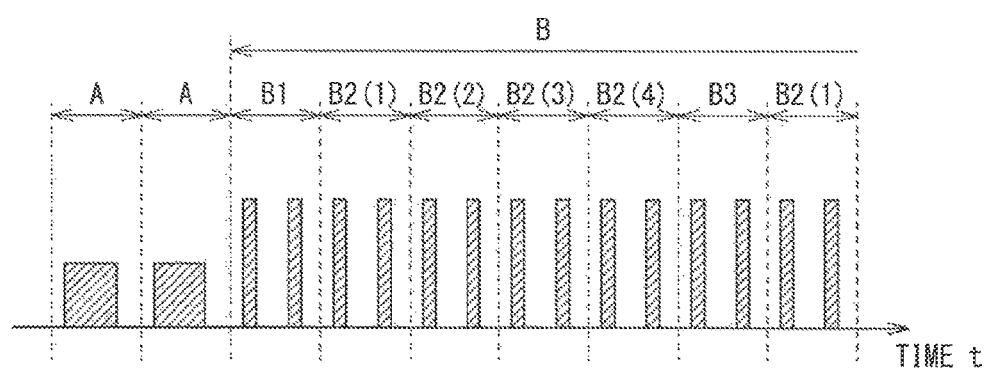

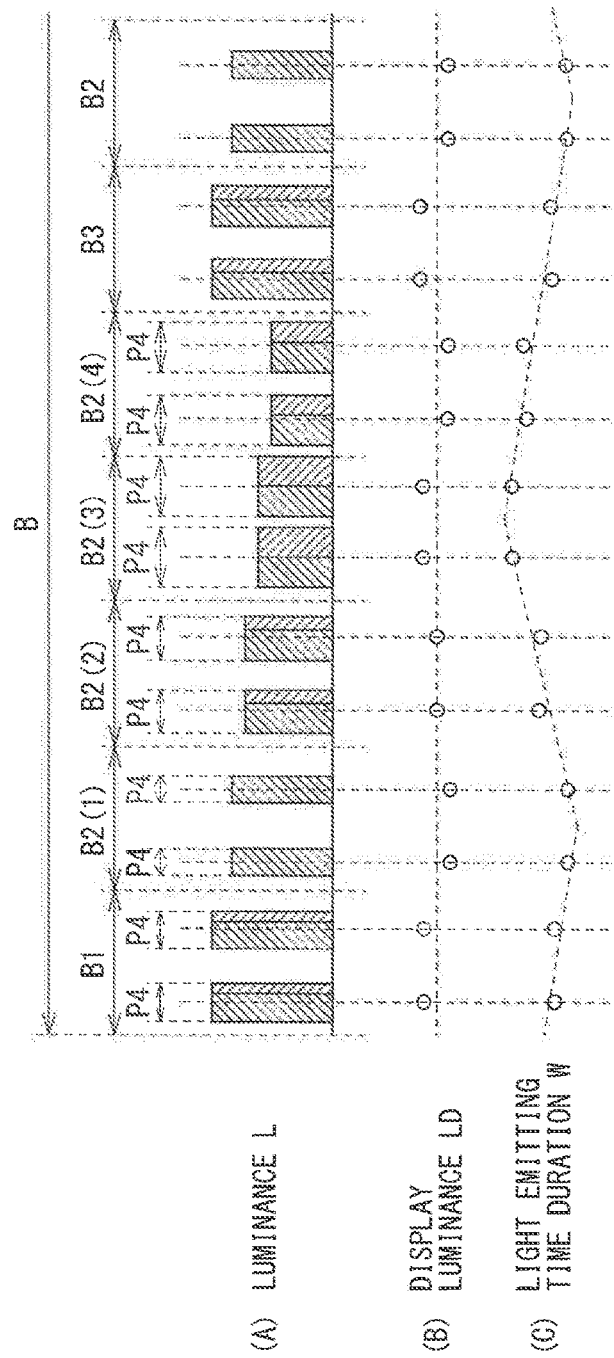
[FIG. 12]

[FIG. 13]
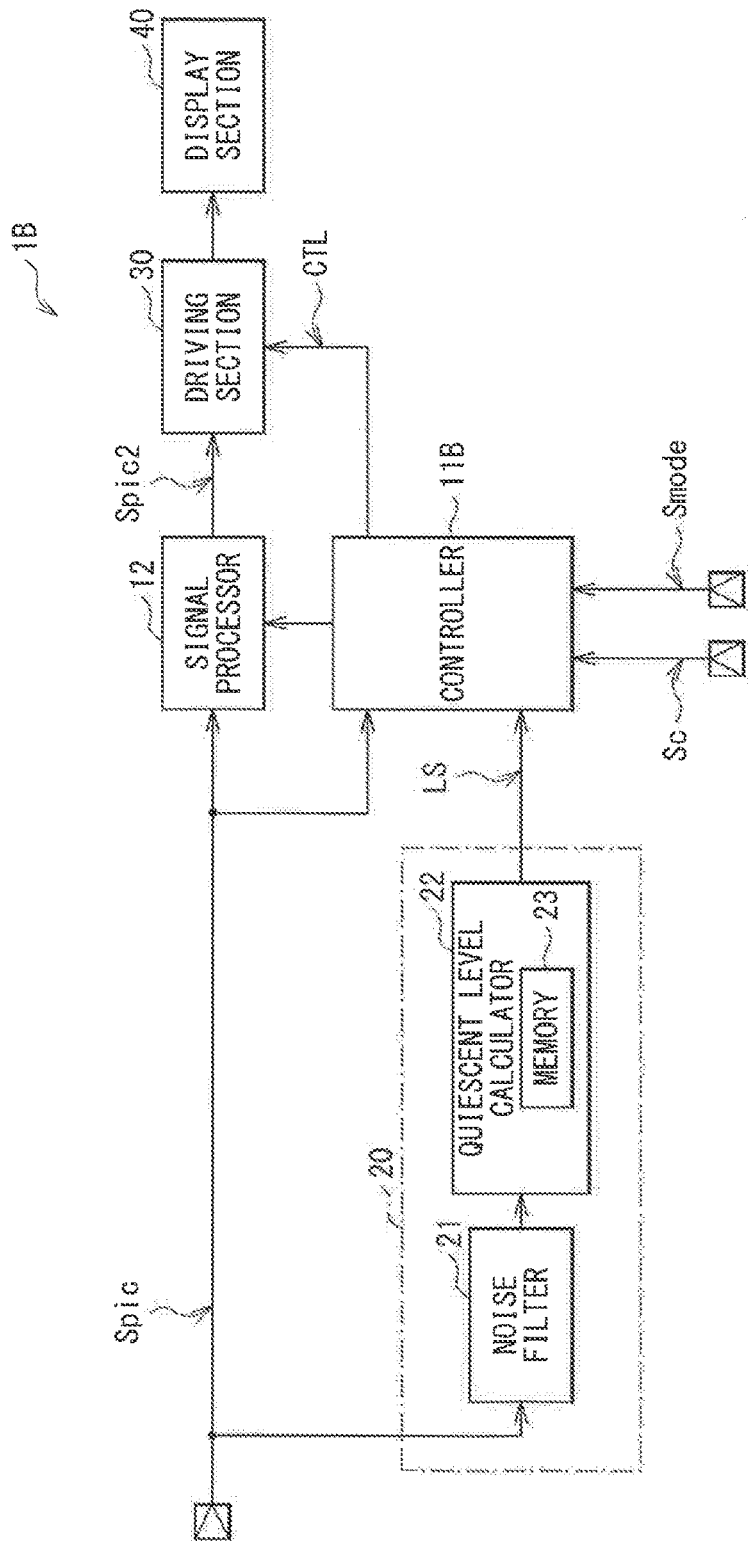

[ FIG. 14A ]
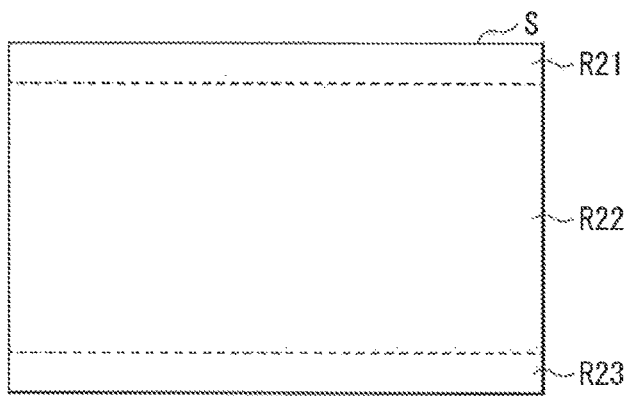
[ FIG. 14B ]
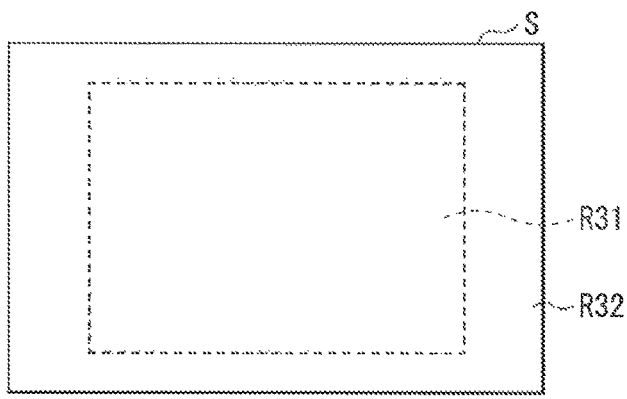

[ FIG. 15 ]
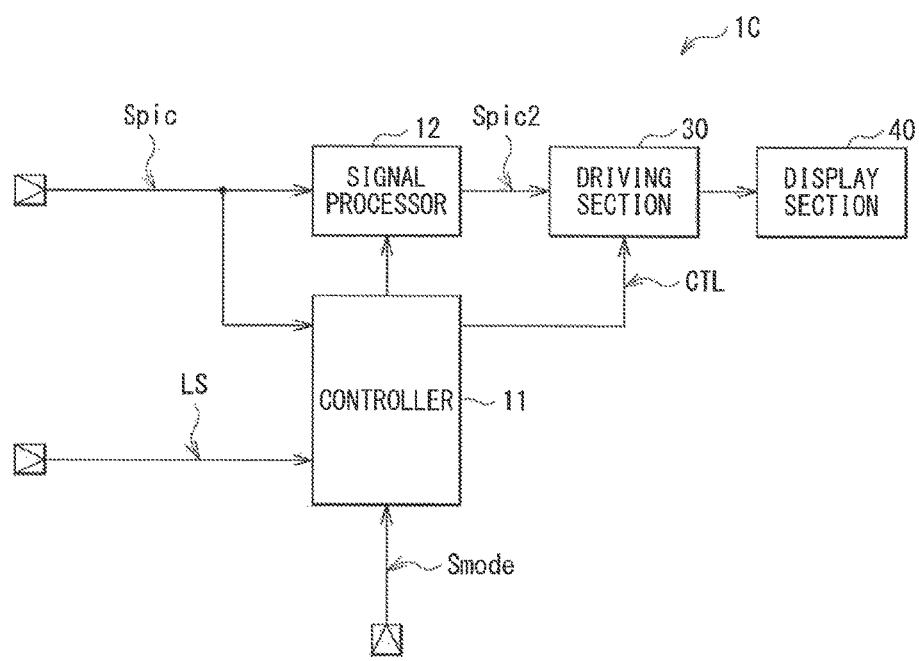

[ FIG. 16 ]
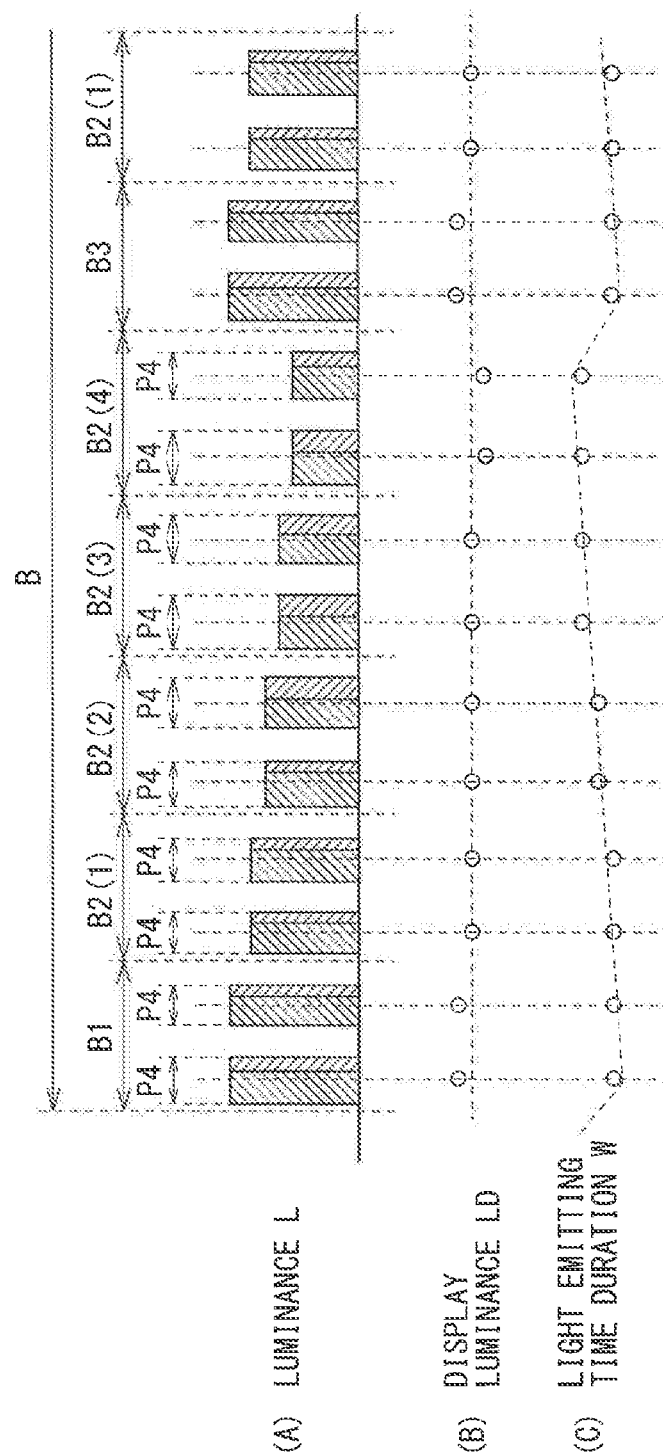

[ FIG. 17 ]
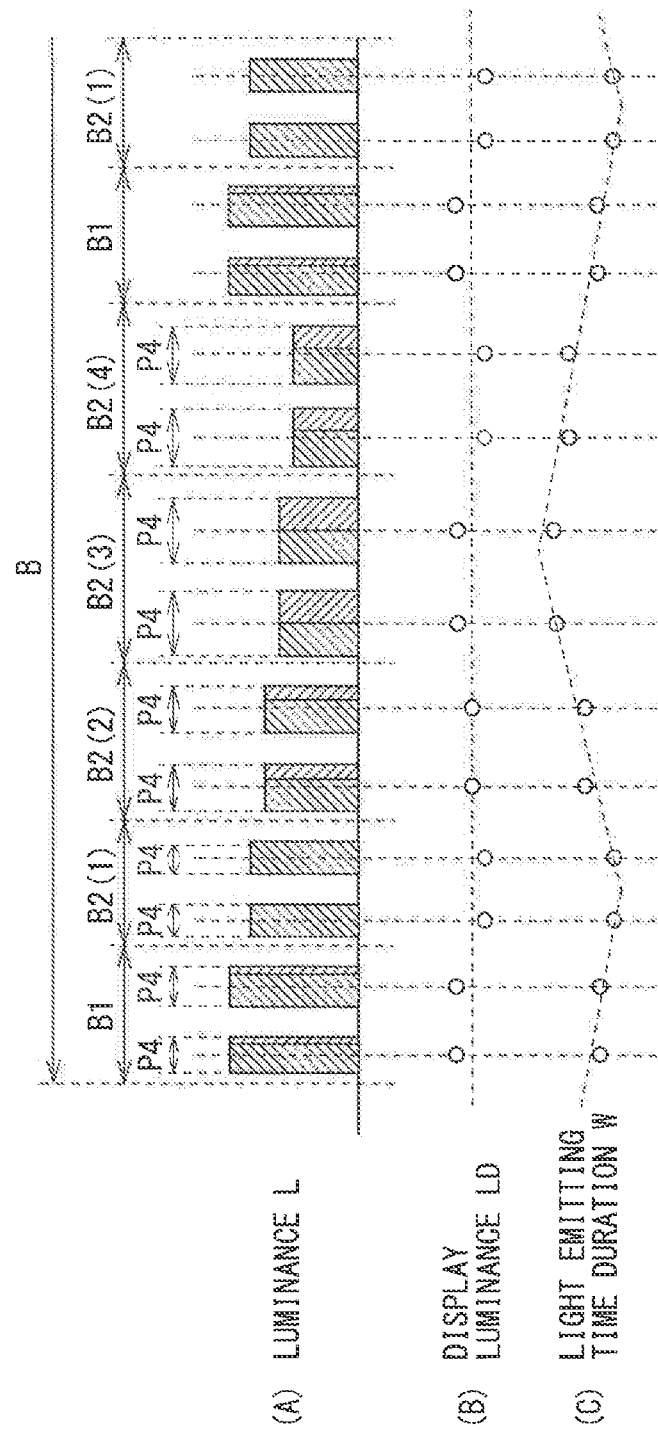

[ FIG. 18 ]
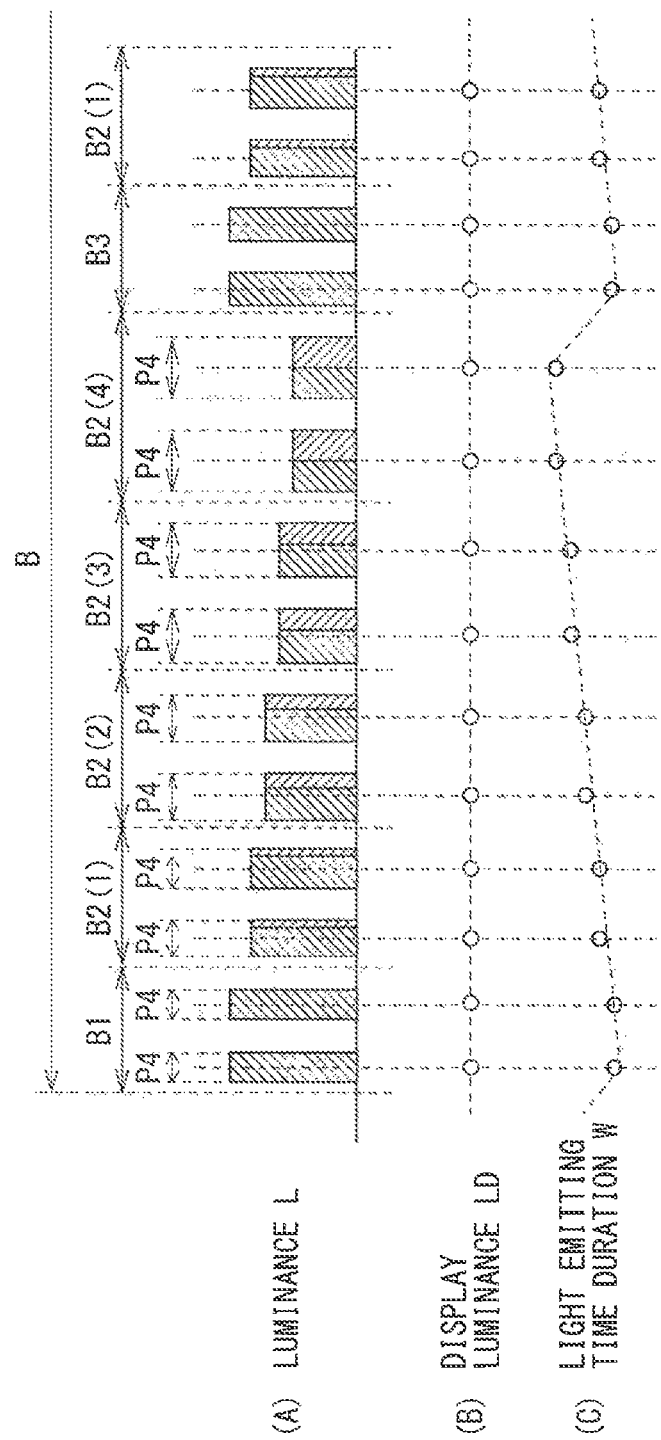

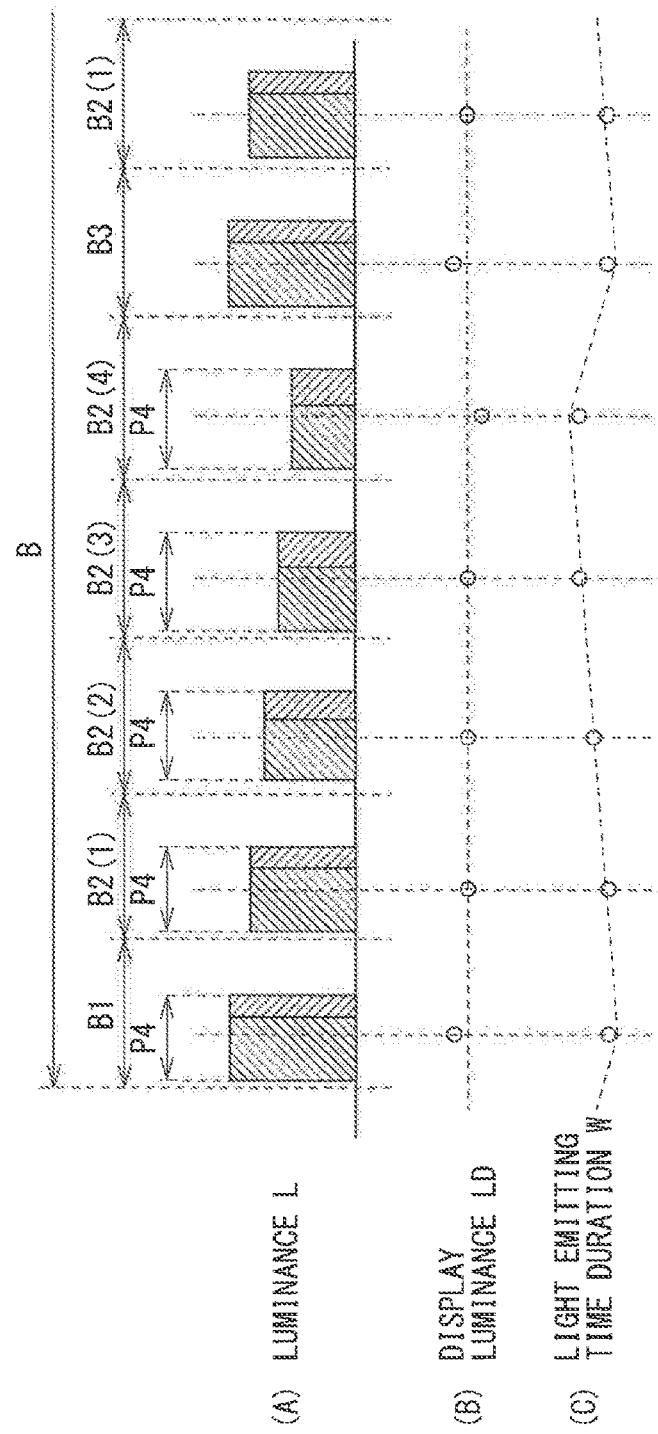

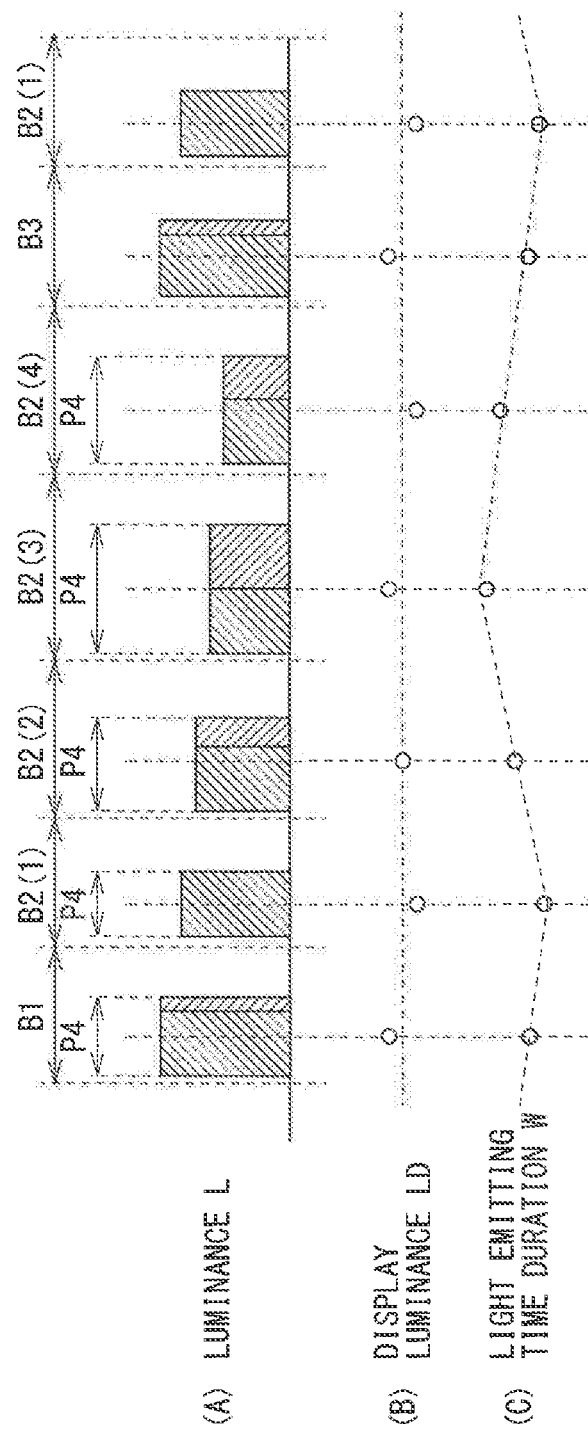

[ FIG. 21 ]
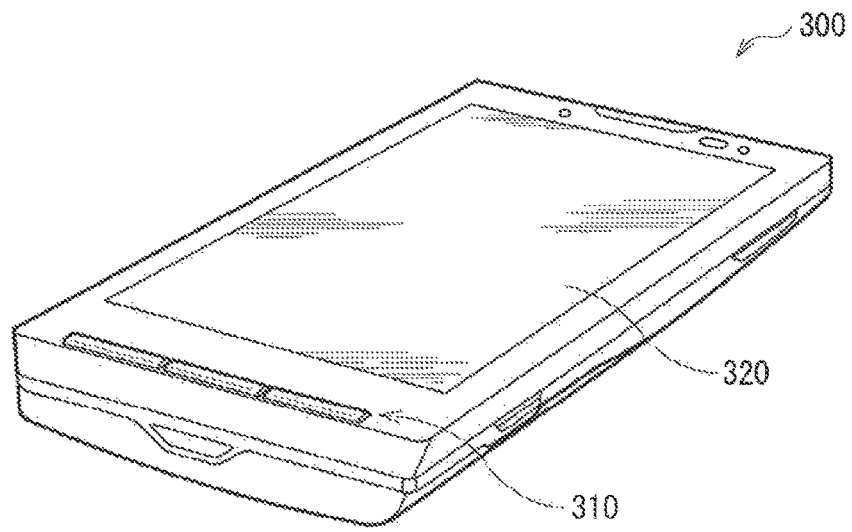
[ FIG. 22 ]
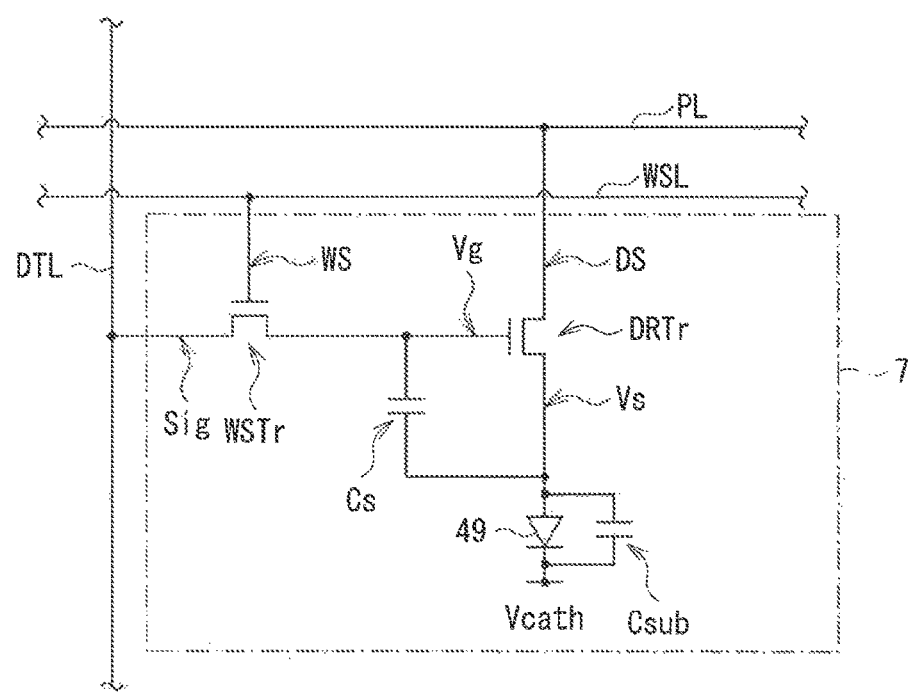

DISPLAY DEVICE, DRIVING METHOD, AND ELECTRONIC APPARATUS

RELATED APPLICATIONS

This application is the U.S. National Phase under 35 U.S.C. § 371 of International Patent Application No. PCT/JP2015/053586, filed on Feb. 10, 2015, which in turn claims the benefit of Japanese Application No. 2014-092770, filed on Apr. 28, 2014, the disclosures of which Applications are incorporated by reference herein.

TECHNICAL FIELD

The disclosure relates to a display device that displays an image, a method of driving such a display device, and an electronic apparatus including such a display device.

BACKGROUND ART

Recently, enhanced and increased functionality of electronic apparatuses has led to development of many electronic apparatuses each including a display device built therein, such as tablet terminals and smartphones. The electronic apparatus with the built-in display device as described above makes it possible to provide a user with various pieces of information, thus achieving a superior user interface.

By the way, each pixel in a display device typically retains a written pixel voltage while emitting light at luminance according to this pixel voltage. In this case, each pixel may fail to sufficiently retain the pixel voltage, and the pixel voltage may therefore vary with time. To suppress degradation of image quality derived from such variation in pixel voltage, various techniques have been developed. As an example, Patent Literature 1 discloses a display device that gradually increases a peak luminance level over a continuous length of time.

CITATION LIST

Patent Literature

Patent Literature 1: Japanese Unexamined Patent Application Publication No. 2008-33066

SUMMARY OF INVENTION

As described above, there has been a demand for improved image quality, and further improvements in the image quality have been expected in a display device.

It is therefore desirable to provide a display device, a driving method, and an electronic apparatus that make it possible to enhance image quality.

A display device according to one embodiment of the disclosure includes a display section and a driving section. The display section has a plurality of unit pixels. The driving section, in a first drive mode, performs write driving and thereafter performs light emission driving in a plurality of light-emitting periods on each of the unit pixels. One of predetermined number of light-emitting periods out of the plurality of light-emitting periods other than a first light-emitting period is longer than the first light-emitting period, and another one of the predetermined number of light-emitting periods is shorter than the first light-emitting period.

A display device according to another embodiment of the disclosure includes a display section and a driving section. The display section has a plurality of unit pixels. The driving section, in a first drive mode, performs write driving and thereafter performs light emission driving in a plurality of light-emitting periods on each of the unit pixels. Of time intervals between start timings of adjacent ones of the light-emitting periods, one time interval is different from another time interval.

A driving method according to one embodiment of the disclosure includes: preparing an image signal; in a first drive mode, performing write driving based on the image signal and thereafter performing light emission driving in a plurality of light-emitting periods on each of unit pixels. Upon the light emission driving, one of predetermined number of light-emitting periods out of the plurality of light-emitting periods other than a first light-emitting period is set to be longer than the first light-emitting period, and another one of the predetermined number of light-emitting periods is set to be shorter than the first light-emitting period.

An electronic apparatus according to one embodiment of the disclosure includes the foregoing display device. Examples of the electronic apparatus may include a television apparatus, an electronic book, a smartphone, a digital camera, a laptop personal computer, a video camera, and a head mount display.

In the display device, the driving method, and the electronic apparatus according to the respective embodiments of the disclosure, the write driving is performed and the light emission driving is performed thereafter in the plurality of light-emitting periods. One of the predetermined number of light-emitting periods out of the plurality of light-emitting periods other than the first light-emitting period is set to be longer than the first light-emitting period, and another one of the predetermined number of light-emitting periods is set to be shorter than the first light-emitting period.

In the display device according to another embodiment of the disclosure, the write driving is performed and the light emission driving is performed thereafter in the plurality of light-emitting periods. In this case, of the time intervals between the start timings of adjacent ones of the light-emitting periods, one time interval is different from another time interval.

According to the display device, the driving method, and the electronic apparatus of the respective embodiments of the disclosure, one of the light-emitting periods is set to be longer than the first light-emitting period, and another one of the light-emitting periods is set to be shorter than the first light-emitting period. This makes it possible to enhance image quality.

According to the display device of the another embodiment of the disclosure, of the time intervals between the start timings of adjacent ones of the light-emitting periods, one time interval is set to be different from another time interval. This makes it possible to enhance image quality.

It is to be noted that the effects described above are not necessarily limiting, and any other effects described in the disclosure may be provided.

BRIEF DESCRIPTION OF DRAWINGS

FIG. 1 is a block diagram illustrating an exemplary configuration of a display device according to some embodiments of the disclosure.

FIG. 2 is a block diagram illustrating an exemplary configuration of a driving section and a display section illustrated in FIG. 1.

FIG. 3 is a circuit diagram illustrating an exemplary configuration of a sub-pixel illustrated in FIG. 2.

FIG. 4 is a schematic diagram illustrating exemplary operation of the sub-pixel illustrated in FIG. 2.

FIG. 5 is an explanatory diagram illustrating exemplary operation of a controller illustrated in FIG. 1.

FIG. 6 is an explanatory diagram illustrating another exemplary operation of the controller illustrated in FIG. 1.

FIG. 7 is a timing waveform chart illustrating exemplary operation of the sub-pixel illustrated in FIG. 2.

FIG. 8 is a timing waveform chart illustrating another exemplary operation of the sub-pixel illustrated in FIG. 2.

FIG. 9 is an explanatory diagram illustrating exemplary operation of a controller according to a first embodiment.

FIG. 10 is an explanatory diagram illustrating exemplary operation of a controller according to Comparative Example.

FIG. 11 is an explanatory diagram illustrating exemplary operation of a controller according to a modification of the first embodiment.

FIG. 12 is another explanatory diagram illustrating another exemplary operation of the controller according to the modification of the first embodiment.

FIG. 13 is a block diagram illustrating an exemplary configuration of a display device according to another modification of the first embodiment.

FIG. 14A is an explanatory diagram illustrating exemplary operation of the display device illustrated in FIG. 13.

FIG. 14B is an explanatory diagram illustrating another exemplary operation of the display device illustrated in FIG. 13.

FIG. 15 is a block diagram illustrating an exemplary configuration of a display device according to another modification of the first embodiment.

FIG. 16 is an explanatory diagram illustrating exemplary operation of a controller according to a second embodiment.

FIG. 17 is an explanatory diagram illustrating exemplary operation of a controller according to a modification of the second embodiment.

FIG. 18 is an explanatory diagram illustrating exemplary operation of a controller according to another modification of the second embodiment.

FIG. 19 is an explanatory diagram illustrating exemplary operation of a controller according to another modification of the second embodiment.

FIG. 20 is an explanatory diagram illustrating exemplary operation of a controller according to another modification of the second embodiment.

FIG. 21 is a perspective view of an external configuration of a smartphone to which a display device according to one embodiment is applied.

FIG. 22 is a circuit diagram illustrating an exemplary configuration of a sub-pixel according to another modification.

DESCRIPTION OF EMBODIMENTS

Some embodiments of the disclosure will be described below in detail with reference to the drawings. It is to be noted that the description will be given in the following order.

1. First Embodiment
2. Second Embodiment
3. Exemplary applications

1. First Embodiment

Exemplary Configuration

FIG. 1 illustrates an exemplary configuration of a display device according to the first embodiment. A display device 1 may be an active matrix type of display device including organic EL (electro luminescence) elements. It is to be noted that a driving method according to some embodiments of the present disclosure will be embodied by this embodiment and therefore described together therewith.

The display device 1 may display an image on the basis of an image signal Spic. In this example, the image signal Spic includes luminance information IR on a red color (R), luminance information IG on a green color (G), and luminance information IB on a blue color (B). The display device 1 may include a driving section 30, a display section 40, a quiescent level detector 20, a controller 11, and a signal processor 12.

The driving section 30 drives the display section 40 on the basis of an image signal Spic2 and a control signal CTL. The display section 40 displays an image on the basis of driving operation performed by the driving section 30.

FIG. 2 illustrates an exemplary configuration of the driving section 30 and the display section 40. The display section 40 may include a plurality of pixels Pix that are arranged in a matrix fashion. Each of the pixels Pix may include a sub-pixel 9R for a red color (R), a sub-pixel 9G for a green color (G), and a sub-pixel 9B for a blue color (B). It is to be noted that, hereinafter, the term "sub-pixel 9" will be used where appropriate to refer to any one of the sub-pixels 9R, 9G, and 9B. The display section 40 includes: a plurality of scan lines WSL and a plurality of power lines PL that extend in a row direction (a lateral direction); and a plurality of data lines DTL that extend in a column direction (a longitudinal direction). The scan lines WSL, the power lines PL, and the data lines DTL each have one end that is coupled to the driving section 30.

FIG. 3 illustrates an exemplary circuit configuration of the sub-pixel 9. The sub-pixel 9 may include a write transistor WSTr, a drive transistor DRTr, a light emitting element 49, and a capacitor Cs. In other words, the sub-pixel 9 is configured using two transistors (the write transistor WSTr and the drive transistor DRTr) and a single capacitor Cs in this example, namely, has a so-called "2Tr1C" configuration.

Each of the write transistor WSTr and the drive transistor DRTr may be configured of an n-channel MOS (metal oxide semiconductor) TFT (thin film transistor), for example. The write transistor WSTr has a gate coupled to the scan line WSL, a source coupled to the data line DTL, and a drain coupled to both a gate of the drive transistor DRTr and one end of the capacitor Cs. The drive transistor DRTr has a gate coupled to both the drain of the write transistor WSTr and the one end of the capacitor Cs, a drain coupled to the power line PL, and a source coupled to both the other end of the capacitor Cs and an anode of the light emitting element 49.

The one end of the capacitor Cs is coupled to the gate of the drive transistor DRTr, etc., whereas the other end of the capacitor Cs is coupled to the source of the drive transistor DRTr, etc. The light emitting element 49 may be a light emitting element configured using an organic EL element. The anode of the light emitting element 49 is coupled to both the source of the drive transistor DRTr and the other end of the capacitor Cs, whereas the cathode of light emitting element 49 is supplied with a cathode voltage Vcath from the driving section 30. It is to be noted that, although the light emitting element 49 is configured using an organic EL element in this example, the light emitting element 49 is not limited thereto, and may be configured using any other current-driven light emitting element.

With this configuration, the sub-pixel 9 performs write operation in response to the turn-on of the write transistor WSTr, so that a potential difference according to a pixel voltage Vsig (described later) is set between the two ends of the capacitor Cs. Further, the drive transistor DRTr causes a drive current according to the potential difference between the two ends of the capacitor Cs to flow through the light emitting element 49. As a result, the light emitting element 49 emits light at luminance L according to the pixel voltage Vsig.

The driving section 30 may include a scan line driving section 31, a power line driving section 32, and a data line driving section 33. The driving section 30 may be formed integrally with the display section 40 or may be provided separately from the display section 40, for example, as an integrated circuit (chip).

The scan line driving section 31 sequentially applies scanning signals WS to the scan lines WSL in accordance with the control signal CTL supplied from the controller 11, thereby sequentially selecting the sub-pixels 9.

The power line driving section 32 sequentially applies power signals DS to the power lines PL in accordance with the control signal CTL supplied from the controller 11, thereby controlling light-emitting operation and non-light-emitting operation of the sub-pixel 9. In this example, a power signal DS makes transitions between three voltages Vccp, Vext, and Vini. The voltage Vccp is a voltage that supplies a current to the drive transistor DRTr to thereby cause the light emitting element 49 to emit light, as will be described later. The voltage Vccp is higher than both the voltages Vext and Vini. The voltage Vext is a voltage that stops light emission of the light emitting element 49 and is higher than the voltage Vini. The voltage Vini is a voltage that initializes the sub-pixel 9.

The data line driving section 33 generates a signal Sig in accordance with the image signal Spic2 supplied from the signal processor 12 and the control signal CTL supplied from the controller 11, and applies the generated signal Sig to each of the data lines DTL. The data line driving section 33 may include a DAC (digital analog converter) 34. The DAC 34 generates the pixel voltage Vsig (an analog voltage) that gives an instruction on luminance of each sub-pixel 9, on the basis of the luminance information IR, IG, and IB (digital codes) included in the image signal Spic2. Further, the data line driving section 33 alternately provides the pixel voltage Vsig and a voltage Vofs used to make Vth correction described later, thereby generating the signal Sig.

With this configuration, the driving section 30 initializes the sub-pixels 9, makes corrections (the Vth correction and a μ (mobility) correction) to suppress influence that element variations between the drive transistors DRTr exert over image quality, and writes the pixel voltages Vsig, as will be described later.

The quiescent level detector 20 illustrated in FIG. 1 generates a quiescent level LS on the basis of the image signal Spic. The quiescent level detector 20 may include a noise filter 21 and a quiescent level calculator 22.

The noise filter 21 removes noise from the luminance information IR, IG, and IB included in the image signal Spic. The quiescent level calculator 22 determines a moving amount of the image on the basis of the luminance information IR, IG, and IB from which noise has been removed by the noise filter 21. Further, the quiescent level calculator 22 calculates the quiescent level LS on the basis of the determined moving amount. When an image expressed by the image signal Spic is a still image, the quiescent level LS has a high value. When an image expressed by the image signal Spic is a moving image, the quiescent level LS has a low value. In this example, the quiescent level calculator 22 may include a memory 23. The memory 23 is a frame memory in this example and stores the luminance information IR, IG, and IB regarding one frame image from which noise has been removed by the noise filter 21. The quiescent level calculator 22 compares the luminance information IR, IG, and IB regarding one frame image which has been supplied from the noise filter 21 and the luminance information IR, IG, and IB regarding one frame which is stored in the memory 23. The quiescent level calculator 22 thereby determines a moving amount of the image and calculates the quiescent level LS on the basis of the determined moving amount. The quiescent level LS may be expressed on a small scale (e.g., in 256 stages) or on a large scale (e.g., in four stages). Further, the quiescent level calculator 22 supplies the generated quiescent level LS to the controller 11.

It is to be noted that, when noise is not severely significant, the noise filter 21 may not be provided. Moreover, when an influence of noise still remains despite the provision of the noise filter 21 and the moving amount of a still image does not sufficiently decrease, for example, a threshold may be provided for the moving amount. When the moving amount is equal to or less than this threshold, the quiescent level calculator 22 may determine that the image is a still image. Moreover, although the memory 23 is provided in the quiescent level calculator 22 in this example, the memory 23 may not necessarily be provided and the quiescent level LS may be obtained by a simpler method. More specifically, for example, it is possible to divide a display region of the display section 40 into a plurality of sub-display regions, to determine average levels of the luminance information IR, IG, and IB within each of the sub-display regions, and to obtain the quiescent level LS on the basis of variation in the average levels with time. This method makes it possible to reduce power consumption and cost.

The controller 11 controls the signal processor 12 and the driving section 30 on the basis of the image signal Spic, the quiescent level LS, and mode information Smode. More specifically, the controller 11 controls whether to perform write driving on each of the sub-pixels 9 in the display section 40, on the basis of the quiescent level LS.

FIG. 4 schematically illustrates operation of the sub-pixel 9. Part (A) thereof illustrates a case where the quiescent level LS is moderate, and Part (B) thereof illustrates a case where the quiescent level LS is high. In this example, the quiescent level LS is sufficiently low before a timing t90 and at and after a timing t91, the quiescent level LS is moderate in a period between the timings t90 and t91 (FIG. 4(A)) or the quiescent level LS is high in this period (FIG. 4(B)).

When the quiescent level LS is sufficiently low, the sub-pixel 9 performs normal operation A within each frame period (1F). In the normal operation A, the sub-pixel 9 performs write operation and performs thereafter light emitting operation. In other words, when the quiescent level LS is sufficiently low, a great movement appears in the image. Therefore, the sub-pixel 9 performs the write operation within each frame period.

Moreover, when the quiescent level LS is moderate (FIG. 4(A)), the sub-pixel 9 performs intermittent write operation B. In this intermittent write operation B, the sub-pixel 9 performs pre-suspension operation B1 in the first frame period and performs thereafter refresh operation B3 in an intermittent manner. In each of the pre-suspension operation B1 and the refresh operation B3, the write operation is performed using the pixel voltage Vsig higher than that in the normal operation A, and light emitting operation is performed thereafter at a light emitting duty ratio DUTY lower than that in the normal operation A, as will be described later. Moreover, in write-suspended operation B2, the light emitting operation is performed at the light emitting duty ratio DUTY equivalent to those in both the pre-suspension operation B1 and the refresh operation B3 without performing the write operation, as will be described later. In this example, the sub-pixel 9 alternately repeats the pre-suspension operation B1 or the refresh operation B3 and the write-suspended operation B2 corresponding to one frame period. In other words, in this example, the number of write-suspended frames NF is set to "1". In other words, when the quiescent level LS is moderate, an intermediate movement appears in the image. Therefore, the sub-pixel 9 performs the write operation in an intermittent manner.

Further, when the quiescent level LS is high (FIG. 4(B)), the sub-pixel 9 performs the intermittent write operation B. In this intermittent write operation B, the sub-pixel 9 alternately repeats the pre-suspension operation B1 or the refresh operation B3 and the write-suspended operation B2 corresponding to four frame periods. In other words, in this example, the number of write-suspended frames NF is set to "4". In other words, when the quiescent level LS is high, a small movement appears in the image. Therefore, the sub-pixel 9 further increases the number of write-suspended frames NF and performs the write operation in an intermittent manner.

In this way, the controller 11 dynamically sets the number of write-suspended frames NF on the basis of the quiescent level LS. Further, the controller 11 supplies the control signal CTL to the driving section 30, controlling the driving section 30 to perform the intermittent write operation B in accordance with the number of write-suspended frames NF.

FIG. 5 illustrates operation of setting the number of write-suspended frames NF on the basis of the quiescent level LS. In this example, the controller 11 sets the number of write-suspended frames NF to a larger value as the quiescent level LS increases. In other words, as the quiescent level LS increases, a movement in the image decreases. Therefore, an image quality is less likely to be lowered even when the write operation is performed at lower frequency. Moreover, in this example, the controller 11 sets the number of write-suspended frames NF to a larger value as a frame rate FR increases. In other words, when the frame rate FR is high, a movement becomes smoother, in which case the risk of causing jerkiness is reduced. Therefore, image quality is less likely to be lowered even when the write operation is performed at lower frequency. In this way, the controller 11 sets the number of write-suspended frames NF in accordance with the quiescent level LS and the frame rate FR. Consequently, the display device 1 makes it possible to reduce power consumption with a lower possibility of image quality being lowered.

As described above, the controller 11 sets the number of write-suspended frames NF on the basis of the quiescent level LS. Consequently, the display device 1 makes it possible to reduce power consumption with a lower possibility of image quality being lowered.

Moreover, the controller 11 also has a function of setting operation of the display device 1 on the basis of the operation mode information Smode. The operation mode information Smode indicates an operation mode of the display device 1. The operation mode information Smode may be supplied from a system of an electronic apparatus employing this display device 1. For example, the operation mode information Smode may be set in accordance with a power consumption setting of the electronic apparatus, an application, etc. Examples of the operation mode may include a normal mode and a plurality of low power consumption modes (minimum, small, medium, etc.). The controller 11 sets the number of write-suspended frames NF on the basis of this operation mode information Smode. More specifically, for example, the controller 11 may set the number of write-suspended frames NF such that the number of write-suspended frames NF becomes larger in the following order: the normal mode, the low power consumption mode (medium), the low power consumption mode (small), and the low power consumption mode (minimum). Further, the controller 11 sets the light emitting duty ratio DUTY in the normal operation A, the light emitting duty ratio DUTY in the intermittent write operation B, etc. on the basis of the operation mode information Smode. This makes it possible to set, for the display device 1, power consumption and set image quality more flexibly in accordance with the power consumption setting of the electronic apparatus, the application, etc.

Moreover, the controller 11 also has a function of directing the signal processor 12 and the driving section 30 to increase the pixel voltage Vsig and directing the driving section 30 to shorten a light-emitting period of the sub-pixel 9, when the intermittent write operation B is performed.

FIG. 6 illustrates the light emitting operation of the sub-pixel 9. In FIG. 6, the vertical axis represents luminance L of the sub-pixel 9, and the horizontal axis represents time t. In this example, when performing the intermittent write operation B, the sub-pixel 9 alternately repeats the pre-suspension operation B1 or the refresh operation B3 and the write-suspended operation B2 (B2(1) to B2(4)) corresponding to four frame periods. The display device 1 sets the luminance L to be higher and the light emitting duty ratio DUTY to be lower when performing the intermittent write operation B than when performing the normal operation A. In this case, the light emitting duty ratio DUTY refers to the time ratio of the light-emitting period to one frame period. In this case, the display device 1 sets the luminance L and the light emitting duty ratio DUTY such that an average value of the luminance L over a frame period in the normal operation A is equal to an average value of the luminance L over a frame period in the write-suspended operation B2 and the like.

More specifically, the controller 11 directs the signal processor 12 to increase values of the luminance information IR, IG, and IB and directs the driving section 30 to shorten the light-emitting period of the sub-pixel 9 via the control signal CTL. In this case, when determining that the values of the luminance information IR, IG, and IB are already sufficiently great and thus it is not possible to further increase these values, the controller 11 directs the driving section 30 to change a reference voltage for the DAC 34 via the control signal CTL, instead of changing the values of the luminance information IR, IG, and IB.

Moreover, the controller 11 also has a function of adjusting the light emitting duty ratio DUTY in accordance with variation in the pixel voltage Vsig of the sub-pixel 9 during the write-suspended operation B2, as will be described later.

More specifically, for example, a leakage current of the capacitor Cs or an off-leakage current of the write transistor WSTr in the sub-pixel 9 may cause the pixel voltage Vsig to be gradually lowered with time. In this case, the luminance L of the sub-pixel 9 may be gradually lowered with time. The display device 1 adjusts the light emitting duty ratio DUTY so as to compensate for this lowering of the luminance L. This makes it possible to suppress degradation of image quality in the display device 1.

The signal processor 12 subjects the image signal Spic to predetermined image processing on the basis of an instruction from the controller 11 and outputs a result of this processing as the image signal Spic2. More specifically, when the intermittent write operation B is performed, the signal processor 12 increases the values of the luminance information IR, IG, and IB included in the image signal Spic, as described above.

In the foregoing example, the intermittent write operation B may correspond to one specific example of a "first drive mode" in the disclosure. The normal operation A may correspond to one specific example of a "second drive mode" in the disclosure. The controller 11, the signal processor 12, and the driving section 30 may correspond to one specific example of a "driving section" in the disclosure.

[Operation and Workings]

Next, a description will be given of operation and workings of the display device 1 according to this embodiment.

(Outline of Overall Operation)

First, a description will be given of an outline of an overall operation of the display device 1, with reference to FIG. 1 and other drawings. The quiescent level detector 20 generates the quiescent level LS on the basis of the image signal Spic. The controller 11 controls the signal processor 12 and the driving section 30 on the basis of the image signal Spic, the quiescent level LS, and the operation mode information Smode. More specifically, the controller 11 sets the number of write-suspended frames NF on the basis of the quiescent level LS and the operation mode information Smode. Further, when the intermittent write operation B is performed, the controller 11 directs the signal processor 12 and the driving section 30 to increase the pixel voltage Vsig and directs the driving section 30 to shorten the light-emitting period of the sub-pixel 9. Furthermore, during the write-suspended operation B2, the controller 11 adjusts the light emitting duty ratio DUTY in accordance with variation in the pixel voltage Vsig for the sub-pixel 9. The signal processor 12 subjects the image signal Spic to predetermined image processing on the basis of an instruction from the controller 11 and outputs the result of this processing as the image signal Spic2. The driving section 30 drives the display section 40 on the basis of the image signal Spic2 supplied from the signal processor 12 and the control signal CTL supplied from the controller 11. The display section 40 displays an image on the basis of the driving operation performed by the driving section 30.

(Detailed Operation)

Next, details of the operation of the sub-pixel 9 will be described. The description will be given first regarding the normal operation A and then regarding the write-suspended operation B2. It is to be noted that descriptions regarding the sub-pixel 9 in the normal operation A2, the pre-suspension operation B1, and the refresh operation B3 will be omitted, as these operations are similar to the normal operation A.

FIG. 7 illustrates a timing chart of the normal operation A of the sub-pixel 9. This drawing illustrates exemplary operation of a single sub-pixel 9 of interest during display driving. In FIG. 7, Part (A) illustrates a waveform of a scanning signal WS, Part (B) illustrates a waveform of the power signal DS, Part (C) illustrates a waveform of the signal Sig, Part (D) illustrates a waveform of a gate voltage Vg of the drive transistor DRTr, and Part (E) illustrates a waveform of a source voltage Vs of the drive transistor DRTr. In Parts (B) to (E) of FIG. 7, the respective waveforms are expressed using the same voltage axis.

Within one horizontal period (1H), the driving section 30 initializes the sub-pixel 9 (an initialization period P1), makes a Vth correction to suppress influence that element variations between the drive transistors DRTr exert over image quality (a Vth correction period P2), and writes the pixel voltage Vsig to the sub-pixel 9 while making a μ (mobility) correction, which is different from the Vth correction (writing·μ correction period P3). Further, the light emitting element 49 in the sub-pixel 9 emits thereafter light at the luminance L according to the written pixel voltage Vsig (a light-emitting period P4). Details of these will be described below.

First, the power line driving section 32 sets the power signal DS to the voltage Vini before the initialization period P1 (Part (B) of FIG. 7). In response thereto, the drive transistor DRTr is turned on, and the source voltage Vs of the drive transistor DRTr is set to the voltage Vini (Part (E) of FIG. 7).

Thereafter, the driving section 30 initializes the sub-pixel 9 during the period from the timing t2 to the timing t3 (the initialization period P1). More specifically, at the timing t2, the data line driving section 33 sets the signal Sig to the voltage Vofs (Part (C) of FIG. 7), and scan line driving sections 31A and 31B vary the voltage of the scanning signal WS from a low level to a high level (Part (A) of FIG. 7). In response thereto, the write transistor WSTr is turned on, and the gate voltage Vg of the drive transistor DRTr is set to the voltage Vofs (Part (D) of FIG. 7). As a result, the gate-source voltage Vgs (=Vofs−Vini) of the drive transistor DRTr is set to a voltage higher than a threshold voltage Vth of the drive transistor DRTr. In this way, the sub-pixel 9 is initialized.

Thereafter, the driving section 30 makes the Vth correction during the period from the timing t3 to timing t4 (the Vth correction period P2). More specifically, at the timing t3, the power line driving section 32 varies the power signal DS from the voltage Vini to the voltage Vccp (Part (B) of FIG. 7). In response thereto, the drive transistor DRTr operates within its saturation region. A current Ids flows from the drain to the source of the drive transistor DRTr, increasing the source voltage Vs (Part (E) of FIG. 7). In this case, the source voltage Vs is lower than the voltage Vcath at the cathode of the light emitting element 49 in this example. Therefore, the light emitting element 49 maintains its reversely-biased state. As a result, no current flows through the light emitting element 49. By increasing the source voltage Vs in this manner, the gate-source voltage Vgs is decreased, and thus the current Ids is decreased. This negative feedback operation makes the current Ids converge into "0" (zero). In other words, the current Ids converges so that the gate-source voltage Vgs of the drive transistor DRTr becomes equal to the threshold voltage Vth of the drive transistor DRTr (Vgs=Vth).

Thereafter, at the timing t4, the scan line driving sections 31A and 31B vary the voltage of the scanning signal WS from the high level to a low level (Part (A) of FIG. 7). In response thereto, the write transistor WSTr is turned off. Further, the data line driving section 33 sets the signal Sig to the pixel voltage Vsig at the timing t5 (FIG. 7(C)).

Thereafter, over the period from a timing t6 to timing t7 (the writing·μ correction period P3), the driving section 30 writes the pixel voltage Vsig to the sub-pixel 9 while making the μ correction. More specifically, the scan line driving sections 31A and 31B vary the voltage of the scanning signal WS from a low level to a high level at the timing t6 (Part (A) of FIG. 7). In response thereto, the write transistor WSTr is turned on, and the gate voltage Vg of the drive transistor DRTr increases from the voltage Vofs to the pixel voltage Vsig (Part (D) of FIG. 7). In this case, the gate-source voltage Vgs of the drive transistor DRTr is higher than the threshold voltage Vth (Vgs>Vth). Since the current Ids flows from the drain to the source, the source voltage Vs of the drive transistor DRTr increases (Part (E) of FIG. 7). This negative feedback operation reduces influence of element variations between the drive transistors DRTr (the μ correction), and the gate-source voltage Vgs of the drive transistor DRTr is set to a voltage Vemi according to the pixel voltage Vsig. It is to be noted that an exemplary method of making the above μ correction is described in Japanese Unexamined Patent Application Publication No. 2006-215213.

Thereafter, the driving section 30 causes the sub-pixel 9 to emit light over the period following the timing t7 (the light-emitting period P4). More specifically, at the timing t7, the scan line driving sections 31A and 31B vary the voltage of the scanning signal WS from the high level to a low level (Part (A) of FIG. 7). In response thereto, the write transistor WSTr is turned off, and the gate of the drive transistor DRTr is brought into a floating state. After that, the voltage between the two ends of the capacitor Cs, namely, the gate-source voltage Vgs of the drive transistor DRTr is maintained. Further, with the current Ids flowing through the drive transistor DRTr, the source voltage Vs of the drive transistor DRTr increases (Part (E) of FIG. 7). In accordance therewith, the gate voltage Vg of the drive transistor DRTr also increases (Part (D) of FIG. 7). Further, when the source voltage Vs of the drive transistor DRTr becomes larger than the sum of the threshold voltage Vel of the light emitting element 49 and the voltage Vcath (Vel+Vcath), a current flows between the anode and cathode of the light emitting element 49. As a result, the light emitting element 49 emits light. In other words, the source voltage Vs increases by an amount corresponding to the element variations between the light emitting elements 49, and consequently the light emitting element 49 emits light.

Thereafter, after a period corresponding to the light emitting duty ratio DUTY has passed, the driving section 30 varies the power signal DS from the voltage Vccp to the voltage Vini. The light-emitting period P4 is thus ended. It is to be noted that, in the normal operation A, the light-emitting period P4 is ended in response to the variation of the power signal DS from the voltage Vccp to the voltage Vini as described above. In each of the pre-suspension operation B1 and the refresh operation B3, the light-emitting period P4 is ended in response to the variation of the power signal DS from the voltage Vccp to the voltage Vext.

FIG. 8 illustrates a timing chart of the write-suspended operation B2 of the sub-pixel 9. Part (A) thereof illustrates a waveform of the scanning signal WS, Part (B) thereof illustrates a waveform of the power signal DS, Part (C) thereof illustrates a waveform of the signal Sig, Part (D) thereof illustrates a waveform of the gate voltage Vg of the drive transistor DRTr, and Part (E) thereof illustrates a waveform of the source voltage Vs of the drive transistor DRTr.

In the write-suspended operation B2, the voltage of the scanning signal WS is always kept at a low level. Therefore, to maintain the write transistor WSTr in an off state, the gate-source voltage Vgs of the drive transistor DRTr is maintained at the voltage Vemi that has been set during the writing·μ correction period P3. It is to be noted that this description is given without taking into consideration a leakage current of the capacitor Cs and the like, for the sake of convenience.

First, the power line driving section 32 sets the power signal DS to the voltage ext (Part (B) of FIG. 8). In response thereto, the drive transistor DRTr is turned on, and the source voltage Vs of the drive transistor DRTr is set to the voltage Vext (Part (E) of FIG. 8).

Further, the driving section 30 causes the sub-pixel 9 to emit light over the period at and after timing t13 (the light-emitting period P4). More specifically, at the timing t13, the power line driving section 32 varies the power signal DS from the voltage Vext to the voltage Vccp (Part (B) of FIG. 8). As a result, the drive transistor DRTr operates within its saturation region. Further, the current Ids flows from the drain to the source, and the source voltage Vs of the drive transistor DRTr increases (Part (E) of FIG. 8). In accordance therewith, the gate voltage Vg of the drive transistor DRTr also increases (Part (D) of FIG. 8). Further, when the source voltage Vs of the drive transistor DRTr becomes larger than the sum (Vel+Vcath) of the threshold voltage Vel of the light emitting element 49 and the voltage Vcath, a current flows between the anode and the cathode of the light emitting element 49. As a result, the light emitting element 49 emits light. In other words, the source voltage Vs increases by an amount corresponding to the element variations in the light emitting elements 49, and consequently, the light emitting element 49 emits light.

Thereafter, after a period corresponding to the light emitting duty ratio DUTY has passed, the driving section 30 varies the power signal DS from the voltage Vccp to the voltage Vext. The light-emitting period P4 is thus ended.

In the intermittent write operation B, the sub-pixel 9 alternately repeats the pre-suspension operation B1 or the refresh operation B3 and the write-suspended operation B2 corresponding to the predetermined number of frame periods. In this write-suspended operation B2, the sub-pixel 9 performs the light emitting operation without performing the write operation. Therefore, when a leakage current of the capacitor Cs, an off-leakage current of the write transistor WSTr, etc. are present, the pixel voltage Vsig may be gradually lowered with time, so that the luminance L of the sub-pixel 9 may be gradually lowered. The display device 1 adjusts the light emitting duty ratio DUTY so as to compensate for this lowering of the luminance L. Details of this operation will be described below.

FIG. 9 illustrates exemplary operation of the sub-pixel 9 in the intermittent write operation B. Part (A) thereof illustrates the luminance L of the sub-pixel 9, Part (B) thereof illustrates an integral value (display luminance LD) of the luminance L over each light-emitting period P4, and Part (C) thereof illustrates time duration (light emitting time duration W) of each light-emitting period P4. FIG. 9 is exaggerated for the sake of convenience in explanation. In this example, the sub-pixel 9 alternately repeats the pre-suspension operation B1 or the refresh operation B3 and the write-suspended operation B2 (B2(1) to B2(4)) corresponding to four frame periods.

In the display device 1, as illustrated in Part (A) of FIG. 9, the luminance L is lowered with time during the write-suspended operation B2, due to a leakage current of the capacitor Cs, etc., for example. The controller 11 adjusts the light emitting duty ratio DUTY so as to compensate for the lowering of the luminance L. More specifically, while keeping a length of the frame period constant, the controller 11 narrows the light emitting time duration W when the luminance L is high or widens the light emitting time duration W when the luminance L is low (Part (C) of FIG. 9), for example. This makes it possible to keep the display luminance LD substantially constant in the display device 1, as illustrated in Part (B) of FIG. 9.

In this case, the controller 11 adjusts the light emitting duty ratio DUTY such that the light emitting time duration W does not vary rapidly. More specifically, in this example, the controller 11 sets the light emitting duty ratios DUTY in the pre-suspension operation B1 and the refresh operation B3 to be higher, by a period $\Delta 1$, than the light emitting duty ratio DUTY in write-suspended operation B2(1) to be performed next. Likewise, the controller 11 sets the light emitting duty ratio DUTY in the third write-suspended operation B2(3) to be higher than the light emitting duty ratio DUTY in the fourth write-suspended operation B2(4). In this way, the display device 1 makes it possible to reduce the possibility of a user perceiving blinks (so-called flickers) in comparison with a display device 1R according to Comparative Example (described later), thus enhancing image quality.

Comparative Example

Next, the display device 1R according to Comparative Example will be described. Comparative Example uses a method of adjusting the light emitting duty ratio DUTY which is different from that of the display device 1 according to the present embodiment. More specifically, in the present embodiment (FIG. 1, FIG. 9, etc.), the display device 1R is configured using the controller 11 that adjusts the light emitting duty ratio DUTY such that the display luminance LD is kept substantially constant and the light emitting time duration W does not vary rapidly. In contrast to this, in Comparative Example, the display device 1R is configured using a controller 11R that does not take into consideration the light emitting time duration W and adjusts the light emitting duty ratio DUTY such that the display luminance LD is kept constant. Other configurations are substantially the same as those in the present embodiment (FIG. 1).

FIG. 10 illustrates exemplary operation of the sub-pixel 9 in the display device 1R. Part (A) thereof illustrates the luminance L of the sub-pixel 9. Part (B) thereof illustrates the display luminance LD. Part (C) thereof illustrates the light emitting time duration W. As illustrated in Part (A) of FIG. 10, the luminance L of the display device 1R is lowered with time. A controller 11D adjusts the light emitting duty ratio DUTY so as to compensate for this lowering of the luminance L. More specifically, the controller 11D gradually widens the light emitting time duration W with time. In other words, the controller 11D adjusts the light emitting duty ratio DUTY such that the display luminance LD is kept constant, as illustrated in Part (B) of FIG. 10. As a result, the light emitting time duration W is gradually widened with time but rapidly narrowed in the refresh operation B3 (Part (C) of FIG. 10).

In the display device 1R according to Comparative Example, as described above, the light emitting time duration W varies rapidly every time the refresh operation B3 is performed. As a result, the display device 1R may cause blinks (so-called flickers) in an image. This intermittent write operation B is performed especially when the quiescent level LS is high (only a small movement appears in a display image). Therefore, flickers tend to appear more prominently than when an image with a great movement is displayed. Furthermore, a user tends to clearly perceive such low-frequency flickers. More specifically, humans tend to clearly perceive a flicker having a frequency of about 70 Hz or lower. The refresh operation B3 is performed less frequently as the quiescent level LS increases. Consequently, the user tends to perceive flickers more clearly as the quiescent level LS increases. An occurrence of such flickers may cause the user to feel that image quality is lowered.

In contrast, in the display device 1 according to the present embodiment, the controller 11 adjusts the light emitting duty ratio DUTY such that the light emitting time duration W does not vary rapidly, as described in FIG. 9. In this way, the display device 1 gradually varies the light emitting time duration W, thereby making it possible to reduce the possibility of causing a user to perceive flickers. This makes it possible to enhance image quality.

Moreover, the display device 1 sets the light emitting duty ratio DUTY to a smaller value when the intermittent write operation B is performed than when the normal operation A is performed, as illustrated in FIG. 6. This makes it possible to reserve a margin used to vary the light emitting duty ratio DUTY to a large value during the intermittent write operation B. As a result, it is possible to compensate for lowering of the luminance L appropriately even when the number of write-suspended frames NF is set to a large value, for example.

Effects

In the embodiment described above, when the intermittent write operation is performed, the light emitting duty ratio is adjusted taking into consideration lowering of the pixel voltage. Therefore, it is possible to enhance image quality.

In the present embodiment, the light emitting duty ratio is adjusted such that the light emitting time duration does not vary rapidly. Therefore, it is possible to enhance image quality.

In the present embodiment, when the light emitting duty ratio is set to a smaller value when the intermittent write operation is performed than when the normal operation is performed. Therefore, it is possible to reserve a margin for the light emitting duty ratio, thereby compensating for lowering of luminance appropriately.

[Modification 1-1]

In the embodiment described above, the sub-pixel 9 emits light once every time each of the pre-suspension operation B1, the write-suspended operation B2, and the refresh operation B3 is performed, as illustrated in FIG. 6 and other drawings. However, this scheme is not limiting. Alternatively, the sub-pixel 9 may emit light multiple times, for example, as in a display device 1A illustrated in FIG. 11 and FIG. 12. In this example, the sub-pixel 9 emits light twice every time each of the pre-suspension operation B1, the write-suspended operation B2, and the refresh operation B3 is performed. In this case, the luminance L and the light emitting duty ratio DUTY are also adjusted such that the average value of the luminance L over one frame period upon the normal operation A becomes equal to the average value of the luminance L over one frame period upon the write-suspended operation B2 or the like. Time lengths of the two light-emitting periods may be set to either the same value or different values. In this example, the light emitting time duration W of each light-emitting period P4 in the pre-suspension operation B1 and the refresh operation B3 is set to be longer than the light emitting time duration W of each light-emitting period P4 in the write-suspended operation B2(1) to be performed next. Furthermore, the light emitting time duration W of each light-emitting period P4 in the third write-suspended operation B2(3) is set to be longer than the light emitting time duration W of each light-emitting period P4 in the fourth write-suspended operation B2(4).

It is to be noted that, in this example, the sub-pixel 9 emits light twice every time each of the pre-suspension operation B1, the write-suspended operation B2, and the refresh operation B3 is performed; however, this scheme is not limiting. Alternatively, the sub-pixel 9 may emit light three times or more, for example. More specifically, the sub-pixel 9 may preferably emit light at frequency at which a user does not perceive blinks (e.g., 70 times or more per second).

[Modification 1-2]

In the embodiment described above, the number of write-suspended frames NF are dynamically set to all the display regions of the display section 40; however, this scheme is not limiting. Alternatively, the number of write-suspended frames NF may be dynamically set to only portions of the display regions of the display section 40. A display device 1B according to the present modification will be described below in detail.

FIG. 13 illustrates an exemplary configuration of the display device 1B. The display device 1B is provided with a controller 11B. The controller 11B controls the signal processor 12 and the driving section 30, in a manner similar to that of the controller 11 according to the embodiment described above. In this case, the controller 11B controls the signal processor 12 and the driving section 30 on the basis of content information Sc. Herein, the content information Sc may be supplied from another circuit, for example, and may represent a type (e.g., movie, data broadcast, etc.) of a content indicated by the image signal Spic.

FIG. 14A and FIG. 14B each illustrate operation of the controller 11B which is based on the content information Sc. As one example, when the content is a movie film, on the basis of the content information Sc, the controller 11B dynamically sets the number of write-suspended frames NF for a middle region R22 on the basis of the quiescent level LS and stops write driving within an upper region R21 and a lower region R23. The region R22 is a portion of a display region S in the display section 40 on which a movie image is to be displayed. Each of the upper region R21 and the lower region R23 is a portion of the display region S on which a so-called black zone is to be displayed. This operation makes it possible to reduce power consumption within the region R22 with reduced possibility of image quality being lowered. This allows for reduction in power consumption within the regions R21 and R23. Moreover, as another example, when the content is a data broadcast, on the basis of the content information Sc, the controller 11B dynamically sets the number of write-suspended frames NF for a middle region R31 on the basis of the quiescent level LS and sets predetermined relatively-large number for a peripheral region R32 as the number of write-suspended frames NF. The middle region R31 has a great movement in an image. The peripheral region R32 has a small movement in an image. This operation makes it possible to reduce power consumption within the region R31 with reduced possibility of image quality being lowered. This allows for reduction in power consumption within the region R32.

[Modification 1-3]

In the embodiment described above, the quiescent level LS is determined on the basis of the image signal Spic; however, this scheme is not limiting. Alternatively, for example, the quiescent level LS may be supplied from the outside, as in a display device 1C illustrated in FIG. 15. The display device 1C includes the controller 11, the signal processor 12, the driving section 30, and the display section 40. In other words, the display device 1C is equivalent to the display device 1 according to the embodiment described above from which the quiescent level detector 20 is removed. This controller 11 is supplied with the quiescent level LS from the outside. The quiescent level LS may be generated by an upstream circuit, for example. Examples of the upstream circuit may include an MPEG (moving picture experts group) decoder and a frame rate conversion circuit.

[Other Modifications]

Moreover, two or more of these modifications may be combined together.

2. Second Embodiment

Next, a display device 2 according to a second embodiment will be described. In this embodiment, the frame period is configured to have a variable length when the intermittent write operation B is performed. It is to be noted that, herein, constituent elements substantially the same as those in the display device 1 according to the first embodiment described above are denoted with the same reference codes and will not be further described where appropriate.

As illustrated in FIG. 1, the display device 2 is provided with a controller 51. The controller 51 adjusts the light emitting time duration W in accordance with variation in the pixel voltage Vsig for the sub-pixel 9 during the write-suspended operation B2, as with the controller 11 according to the first embodiment described above. In this case, the controller 51 changes the length of the frame period while adjusting the light emitting time duration W such that display luminance LD is kept substantially constant.

FIG. 16 illustrates exemplary operation of the sub-pixel 9 in the intermittent write operation B. Part (A) thereof illustrates the luminance L of the sub-pixel 9, Part (B) thereof illustrates an integral value (display luminance LD) of the luminance L over each light-emitting period P4, and Part (C) thereof illustrates time duration (the light emitting time duration W) of each light-emitting period P4. FIG. 16 is exaggerated for the sake of convenience in explanation. In this example, the sub-pixel 9 alternately repeats the pre-suspension operation B1 or the refresh operation B3 and the write-suspended operation B2 (B2(1) to B2(4)) corresponding to four frame periods. It is to be noted that the sub-pixel 9 emits light twice during each of the pre-suspension operation B1, the write-suspended operation B2, and the refresh operation B3; however, this scheme is not limiting. The sub-pixel 9 may emit light once or may emit light three or more times.

The controller 51 adjusts the light emitting time duration W so as to compensate for lowering of the luminance L (Part (A) of FIG. 16). In this case, the controller 51 controls the operation such that an interval between adjacent light-emitting periods P4 is kept constant. Under this control, in the display device 2, an operational period of each of the pre-suspension operation B1, the write-suspended operations B2(1) to B2(4), and the refresh operation B3 varies depending on the light emitting time duration W. In other words, in the display device 2, the length of the frame period varies during the intermittent write operation B. This makes it possible to increase flexibility of operation in the display device 2, enhancing image quality.

Moreover, the controller 51 sets the light emitting time duration W of each light-emitting period P4 in the pre-suspension operation B1 and the refresh operation B3 to be nearly equal to the light emitting time duration W of each light-emitting period P4 in the write-suspended operation B2(1). In addition, the controller 51 sets the light emitting time duration W of each light-emitting period P4 in the write-suspended operation B2(3) to be nearly equal to the light emitting time duration W of each light-emitting period P4 in the write-suspended operation B2(4). In this way, the display device 2 suppresses rapid variation in the light emitting time duration W, making it possible to reduce the possibility of a user perceiving blinks in the image. This makes it possible to enhance image quality.

In this embodiment, as described above, the length of the frame period varies in the intermittent write operation. This makes it possible to increase flexibility of operation, enhancing image quality. Other effects are substantially the same as those in the first embodiment described above.

[Modification 2-1]

In the embodiment described above, the light emitting time duration W in the pre-suspension operation B1 and the refresh operation B3 is set to be nearly equal to the light emitting time duration W in the write-suspended operation B2(1). In addition, the light emitting time duration W in the write-suspended operation B2(3) is set to be nearly equal to the light emitting time duration W in the write-suspended operation B2(4). However, this scheme is not limiting. Alternatively, for example, as illustrated in FIG. 17, the light emitting time duration W in the pre-suspension operation B1 and the refresh operation B3 may be set to be longer than the light emitting time duration W in the write-suspended operation B2(1). In addition, the light emitting time duration W in the write-suspended operation B2(3) may be set to be longer than the light emitting time duration W in the write-suspended operation B2(4).

[Modification 2-2]

Moreover, as illustrated in FIG. 18, for example, the light emitting time duration W may be gradually widened so as to compensate for lowering of the luminance L, and the light emitting time duration W may be adjusted such that the display luminance LD is kept constant. Also in this case, it is possible to increase flexibility of operation, thus enhancing image quality.

[Modification 2-3]

In the embodiment described above, as illustrated in FIG. 16 and other drawings, the sub-pixel 9 emits light twice during each of the pre-suspension operation B1, the write-suspended operation B2, and the refresh operation B3; however, this scheme is not limiting. Alternatively, the sub-pixel 9 may emit light once, for example, as illustrated in FIG. 19 and FIG. 20. FIG. 19 corresponds to the example of the second embodiment described above (FIG. 16). FIG. 20 corresponds to the example of the modification 2-1 described above (FIG. 17).

[Other Modifications]

The modifications of the first embodiment described above may be applied to the display device 2 according to the embodiment described above.

3. Exemplary Applications

Next, a description will be given of exemplary applications of the display device described in any of the foregoing embodiments. The display device in any of the foregoing embodiments is applicable to display devices in electronic apparatuses in various fields which perform display on the basis of an image signal received from the outside or an image signal generated therein. Examples of such electronic apparatuses may include a television apparatus, an electronic book, a smartphone (multifunction portable phone), a digital camera, a laptop personal computer, a video camera, and a head mount display.

FIG. 21 is an appearance of outside of a smartphone 300. This smartphone 300 may include an operation section 310 and a display section 320. The display section 320 may be configured of the foregoing display device.

A display device described in any of the foregoing embodiments is applicable to various electronic apparatuses. The present technology reduces power consumption and enhances image quality. The present technology contributes greatly to prolonged driven time of a battery in a portable electronic apparatus and improved image quality of the portable electronic apparatus.

The present technology has been described referring to some embodiments, modifications, and exemplary applications to electronic apparatuses. However, the present technology is not limited to such embodiments and the like and may be variously modifiable.

As one example, although a single capacitor Cs is disposed in each of the sub-pixels 9 in the foregoing embodiments, a configuration of each of the sub-pixels 9 is not limiting. Alternatively, a capacitor Csub may be disposed, for example, as in a sub-pixel 7 illustrated in FIG. 22. The capacitor Csub may have one end coupled to the anode of the light emitting element 49 and the other end coupled to the cathode of the light emitting element 49. In short, the sub-pixel 7 may be configured using two transistors (the write transistor WSTr and the drive transistor DRTr) and two capacitors Cs and Csub, namely, may have a so-called "2Tr2C" configuration.

As another example, the present technology is applicable to various uses in which an interval between one write operation and the subsequent write operation is set to 30 [msec] or longer.

It is to be noted that the effects described herein are mere exemplary and thus not limiting. Further, any other effect may be provided.

It is to be noted that the present technology may be configured as follows.

(1) A display device including:
a display section having a plurality of unit pixels; and
a driving section that, in a first drive mode, performs write driving and thereafter performs light emission driving in a plurality of light-emitting periods on each of the unit pixels, wherein
one of predetermined number of light-emitting periods out of the plurality of light-emitting periods other than a first light-emitting period is longer than the first light-emitting period, and
another one of the predetermined number of light-emitting periods is shorter than the first light-emitting period.

(2) The display device according to (1), wherein time intervals between start timings of adjacent ones of the light-emitting periods are equal to each other.

(3) The display device according to (1), wherein, of time intervals between start timings of adjacent ones of the light-emitting periods, one time interval is different from another time interval.

(4) The display device according to (3), wherein two non-light-emitting periods sandwiching each of the light-emitting periods have same length.

(5) The display device according to any one of (1) to (4), wherein the driving section sets, on a basis of an image signal, a single light-emitting period in a period corresponding to a frame period indicated by the image signal, and drives each of the unit pixels.

(6) The display device according to any one of (1) to (4), wherein the driving section sets, on a basis of an image signal, two or more light-emitting periods in a period corresponding to a frame period indicated by the image signal, and drives each of the unit pixels.

(7) The display device according to any one of (1) to (6), wherein the driving section selects one from among a plurality of drive modes including the first drive mode and drives each of the unit pixels in the selected drive mode.

(8) The display device according to (7), wherein
the plurality of drives include a second drive mode, and
in the second drive mode, the driving section performs the write driving and thereafter performs the light emission driving in a single light-emitting period on each of the unit pixels.

(9) The display device according to (8), wherein each of the light-emitting periods in the first drive mode is shorter than each of the light-emitting periods in the second drive mode.

(10) The display device according to (8) or (9), wherein
the driving section writes a pixel voltage to each of the unit pixels upon the write driving, and
a luminance level indicated by the pixel voltage in the first drive mode is higher than a luminance level indicated by the pixel voltage in the second drive mode.

(11) The display device according to any one of (7) to (10), wherein the driving section selects one from among the plurality of drive modes on a basis of a moving amount in an image to be displayed in the display section.

(12) The display device according to any one of (7) to (11), wherein the driving section selects one from among the plurality of drive modes on a basis of content of an image to be displayed in the display section.

(13) A display device including:
a display section having a plurality of unit pixels; and
a driving section that, in a first drive mode, performs write driving and thereafter performs light emission driving in a plurality of light-emitting periods on each of the unit pixels, wherein,
of time intervals between start timings of adjacent ones of the light-emitting periods, one time interval is different from another time interval.

(14) The display device according to (13), wherein two non-light-emitting periods sandwiching each of the light-emitting periods have same length.

(15) The display device according to (13) or (14), wherein one of predetermined number of light-emitting periods out of the plurality of light-emitting periods other than a first light-emitting period is longer than the first light-emitting period.

(16) The display device according to any one of (13) to (15), wherein, of two adjacent ones of the light-emitting periods, a length of a later light-emitting period is equal to or more than a length of an earlier light-emitting period.

(17) The display device according to any one of (13) to (15), wherein the first light-emitting period is longer than one of the predetermined number of light-emitting periods.

(18) A driving method including:
preparing an image signal;
in a first drive mode, performing write driving based on the image signal and thereafter performing light emission driving in a plurality of light-emitting periods on each of unit pixels; and,
upon the light emission driving, setting one of predetermined number of light-emitting periods out of the plurality of light-emitting periods other than a first light-emitting period to be longer than the first light-emitting period, and setting another one of the predetermined number of light-emitting periods to be shorter than the first light-emitting period.

(19) An electronic apparatus including:
a display device; and
a controller that controls operation of the display device, the display device including
a display section having a plurality of unit pixels, and
a driving section that, in a first drive mode, performs write driving and thereafter performs light emission driving in a plurality of light-emitting periods on each of the unit pixels, wherein
one of predetermined number of light-emitting periods out of the plurality of light-emitting periods other than a first light-emitting period is longer than the first light-emitting period, and
another one of the predetermined number of light-emitting periods is shorter than the first light-emitting period.

This application claims the benefit of priority from Japanese Priority Patent Application JP 2014-092770 filed Apr. 28, 2014, the entire contents of each which is incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display device comprising:
a display section having a plurality of unit pixels; and
a driving section that, in a first drive mode performed over a plurality of consecutive frame periods indicated by an image signal, performs write driving operations, each of which is performed in one frame period and is followed by an light emission driving operations, and thereafter performs light emission driving operations, each of which is performed within one frame period with no write operation, in a plurality of light-emitting periods on each of the unit pixels, wherein:
one of predetermined number of light-emitting periods out of the plurality of light-emitting periods other than a first light-emitting period is longer than the first light-emitting period, and
another one of the predetermined number of light-emitting periods is shorter than the first light-emitting period.

2. The display device according to claim 1, wherein time intervals between start timings of adjacent ones of the light-emitting periods are equal to each other.

3. The display device according to claim 1, wherein, of time intervals between start timings of adjacent ones of the light-emitting periods, one time interval is different from another time interval.

4. The display device according to claim 3, wherein two non-light-emitting periods sandwiching each of the light-emitting periods have same length.

5. The display device according to claim 1, wherein the driving section sets, on a basis of the image signal, a one light-emitting period within one frame period indicated by the image signal, and drives each of the unit pixels.

6. The display device according to claim 1, wherein the driving section sets, on a basis of the image signal, two or more light-emitting periods within one frame period indicated by the image signal, and drives each of the unit pixels.

7. The display device according to claim 1, wherein the driving section selects one from among a plurality of drive modes including the first drive mode and drives each of the unit pixels in the selected drive mode.

8. The display device according to claim 7, wherein:
the plurality of drives include a second drive mode, and
in the second drive mode, the driving section performs the write driving operation and thereafter performs the light emission driving operation within one frame period on each of the unit pixels.

9. The display device according to claim 8, wherein each of the light-emitting periods in the first drive mode is shorter than each of the light-emitting periods in the second drive mode.

10. The display device according to claim 8, wherein:
the driving section writes a pixel voltage to each of the unit pixels upon the write driving operation, and
a luminance level indicated by the pixel voltage in the first drive mode is higher than a luminance level indicated by the pixel voltage in the second drive mode.

11. The display device according to claim 7, wherein the driving section selects one from among the plurality of drive modes on a basis of a moving amount in an image to be displayed in the display section.

12. The display device according to claim 7, wherein the driving section selects one from among the plurality of drive modes on a basis of content of an image to be displayed in the display section.

13. A display device comprising:
a display section having a plurality of unit pixels; and
a driving section that, in a first drive mode performed over a plurality of consecutive frame periods indicated by an image signal, performs write driving operations, each of which is performed in one frame period and is followed by an light emission driving operations, and thereafter performs light emission driving operations, each of which is performed in one frame period with no write operation, in a plurality of light-emitting periods on each of the unit pixels,
wherein, of time intervals between start timings of adjacent ones of the light-emitting periods, one time interval is different from another time interval.

14. The display device according to claim 13, wherein two non-light-emitting periods sandwiching each of the light-emitting periods have same length.

15. The display device according to claim 13, wherein one of predetermined number of light-emitting periods out of the plurality of light-emitting periods other than a first light-emitting period is longer than the first light-emitting period.

16. The display device according to claim 13, wherein, of two adjacent ones of the light-emitting periods, a length of a later light-emitting period is equal to or more than a length of an earlier light-emitting period.

17. The display device according to claim 13, wherein the first light-emitting period is longer than one of the predetermined number of light-emitting periods.

18. A driving method comprising:
preparing an image signal;
in a first drive mode performed over a plurality of consecutive frame periods indicated by the image signal, performing, based on the image signal, write driving operations, each of which is performed in one frame period and is followed by an light emission driving operations, and thereafter performing light emission driving operations, each of which is performed in one frame period with no write operation, in a plurality of light-emitting periods on each of unit pixels; and,
upon the light emission driving, setting one of predetermined number of light-emitting periods out of the plurality of light-emitting periods other than a first light-emitting period to be longer than the first light-emitting period, and setting another one of the predetermined number of light-emitting periods to be shorter than the first light-emitting period.

19. An electronic apparatus comprising:
a display device; and
a controller that controls operation of the display device,
the display device including
a display section having a plurality of unit pixels, and
a driving section that, in a first drive mode performed over a plurality of consecutive frame periods indicated by the image signal, performs write driving operations, each of which is performed in one frame period and is followed by an light emission driving operations, and thereafter performs light emission driving operations, each of which is performed in one frame period with no write operation, in a plurality of light-emitting periods on each of the unit pixels, wherein:
one of predetermined number of light-emitting periods out of the plurality of light-emitting periods other than a first light-emitting period is longer than the first light-emitting period, and
another one of the predetermined number of light-emitting periods is shorter than the first light-emitting period.

* * * * *